United States Patent
Vullaganti

(10) Patent No.: US 8,036,846 B1
(45) Date of Patent: *Oct. 11, 2011

(54) VARIABLE IMPEDANCE SENSE ARCHITECTURE AND METHOD

(75) Inventor: Kalyana C. Vullaganti, Dallas, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 69 days.

This patent is subject to a terminal disclaimer.

(21) Appl. No.: 11/540,996

(22) Filed: Sep. 28, 2006

Related U.S. Application Data

(60) Provisional application No. 60/728,476, filed on Oct. 20, 2005.

(51) Int. Cl.
*H03K 17/16* (2006.01)
(52) U.S. Cl. ........ 702/104; 702/107; 702/110; 326/121; 326/30; 324/158.1; 324/763
(58) Field of Classification Search ............ 702/104, 702/107, 110, 57, 64, 65, 100; 326/21, 30, 326/121; 324/158.1, 763, 600, 601, 629, 324/649, 691; 327/100, 524, 568, 588; 374/100, 374/101, 137, 141, 142; 377/1, 13–16, 19
See application file for complete search history.

(56) References Cited

U.S. PATENT DOCUMENTS

| | | |
|---|---|---|
| 3,737,673 A | 6/1973 | Suzuki |
| 3,878,483 A | 4/1975 | Richardson |
| 3,942,160 A | 3/1976 | Yu |
| 3,973,139 A | 8/1976 | Dingwall |
| 4,042,838 A | 8/1977 | Street et al. |
| 4,100,437 A | 7/1978 | Hoff, Jr. |
| 4,185,321 A | 1/1980 | Iwahashi et al. |
| 4,217,502 A | 8/1980 | Suzuki et al. |
| 4,219,743 A | 8/1980 | Millns et al. |
| 4,301,383 A | 11/1981 | Taylor |
| 4,329,600 A | 5/1982 | Stewart |
| 4,371,271 A * | 2/1983 | Bellet ............ 374/183 |
| 4,388,537 A | 6/1983 | Kanuma |
| 4,433,393 A | 2/1984 | Oritani |
| 4,464,590 A | 8/1984 | Rapp |
| 4,473,762 A | 9/1984 | Iwahashi et al. |
| 4,484,092 A | 11/1984 | Campbell, Jr. |
| 4,484,149 A | 11/1984 | Holloway |
| 4,503,343 A | 3/1985 | Ohuchi |
| 4,514,704 A | 4/1985 | Curtis |
| 4,516,225 A | 5/1985 | Frederick |
| 4,540,898 A | 9/1985 | Pumo et al. |

(Continued)

FOREIGN PATENT DOCUMENTS

EP 0045133 A1 3/1982

(Continued)

OTHER PUBLICATIONS

U.S. Appl. No. 11/540,831, Vullaganti et al.

(Continued)

*Primary Examiner* — Sujoy K Kundu

(57) ABSTRACT

A variable impedance sense (VIS) circuit (400) can detect a drift in the impedance of variable impedance circuits due to changes in operating conditions. Adjustments to binary impedance setting codes are made in response to a detected drift only when such changes do not increase a worst case variation from a target impedance. Adjustments can also be made in response to a detected input offset polarity.

21 Claims, 15 Drawing Sheets

U.S. PATENT DOCUMENTS

| | | |
|---|---|---|
| 4,543,561 A | 9/1985 | Holloway |
| 4,574,273 A | 3/1986 | Atsumi et al. |
| 4,585,958 A | 4/1986 | Chung et al. |
| 4,612,462 A | 9/1986 | Asano et al. |
| 4,612,631 A | 9/1986 | Ochii |
| 4,616,344 A | 10/1986 | Noguchi et al. |
| 4,627,032 A | 12/1986 | Kolwicz et al. |
| 4,627,085 A | 12/1986 | Yuen |
| 4,636,983 A | 1/1987 | Young et al. |
| 4,656,608 A | 4/1987 | Aoyama |
| 4,678,943 A | 7/1987 | Uragami et al. |
| 4,684,831 A | 8/1987 | Kruest |
| 4,723,108 A | 2/1988 | Murphy et al. |
| 4,725,746 A | 2/1988 | Segawa et al. |
| 4,736,125 A | 4/1988 | Yuen |
| 4,742,493 A | 5/1988 | Lewallen et al. |
| 4,751,404 A | 6/1988 | Yuen |
| 4,758,743 A | 7/1988 | Dehganpour et al. |
| 4,769,589 A | 9/1988 | Rosenthal |
| 4,785,427 A | 11/1988 | Young |
| 4,800,298 A | 1/1989 | Yu et al. |
| 4,807,191 A | 2/1989 | Flannagan |
| 4,835,420 A | 5/1989 | Rosky |
| 4,845,385 A | 7/1989 | Ruth, Jr. |
| 4,860,259 A | 8/1989 | Tobita |
| 4,864,162 A | 9/1989 | Maoz |
| 4,873,669 A | 10/1989 | Furutani et al. |
| 4,874,970 A | 10/1989 | Coy et al. |
| 4,875,003 A | 10/1989 | Burke |
| 4,876,216 A | 10/1989 | Tobias et al. |
| 4,877,978 A | 10/1989 | Platt |
| 4,918,664 A | 4/1990 | Platt |
| 4,926,065 A | 5/1990 | Coy et al. |
| 4,948,991 A | 8/1990 | Schucker et al. |
| 4,954,769 A | 9/1990 | Kalthoff |
| 4,959,564 A | 9/1990 | Steele |
| 4,970,414 A | 11/1990 | Ruth, Jr. |
| 4,972,101 A | 11/1990 | Partovi et al. |
| 4,991,141 A | 2/1991 | Tran |
| 5,023,841 A | 6/1991 | Akrout et al. |
| 5,027,013 A | 6/1991 | Coy et al. |
| 5,031,142 A | 7/1991 | Castro |
| 5,036,222 A | 7/1991 | Davis |
| 5,038,056 A | 8/1991 | Koide et al. |
| 5,045,717 A | 9/1991 | Moen, Jr. et al. |
| 5,045,722 A | 9/1991 | Yang et al. |
| 5,047,711 A | 9/1991 | Smith et al. |
| 5,051,625 A | 9/1991 | Ikeda et al. |
| 5,057,715 A | 10/1991 | Larsen et al. |
| 5,065,055 A | 11/1991 | Reed |
| 5,068,831 A | 11/1991 | Hoshi et al. |
| 5,073,726 A | 12/1991 | Kato et al. |
| 5,079,449 A | 1/1992 | Obata |
| 5,083,294 A | 1/1992 | Okajima |
| 5,088,065 A | 2/1992 | Hanamura et al. |
| 5,097,148 A | 3/1992 | Gabara |
| 5,132,936 A | 7/1992 | Keswick et al. |
| 5,140,190 A | 8/1992 | Yoo et al. |
| 5,146,118 A | 9/1992 | Nakamura et al. |
| 5,150,186 A | 9/1992 | Pinney et al. |
| 5,153,450 A | 10/1992 | Ruetz |
| 5,157,282 A | 10/1992 | Ong et al. |
| 5,162,672 A | 11/1992 | McMahan et al. |
| 5,166,555 A | 11/1992 | Kano |
| 5,179,299 A | 1/1993 | Tipon |
| 5,212,440 A | 5/1993 | Waller |
| 5,216,290 A | 6/1993 | Childers |
| 5,218,242 A | 6/1993 | Imazu et al. |
| 5,229,668 A | 7/1993 | Hughes, Jr. et al. |
| 5,233,559 A | 8/1993 | Brennan, Jr. |
| 5,239,211 A | 8/1993 | Jinbo |
| 5,241,221 A | 8/1993 | Fletcher et al. |
| 5,241,502 A | 8/1993 | Lee et al. |
| 5,245,273 A | 9/1993 | Greaves et al. |
| 5,252,909 A | 10/1993 | Aizaki |
| 5,267,205 A | 11/1993 | Hamada |
| 5,270,588 A | 12/1993 | Choi |
| 5,272,390 A | 12/1993 | Watson, Jr. et al. |
| 5,272,395 A | 12/1993 | Vincelette |
| 5,281,869 A | 1/1994 | Lundberg |
| 5,300,828 A | 4/1994 | McClure |
| 5,319,252 A | 6/1994 | Pierce et al. |
| 5,319,258 A | 6/1994 | Ruetz |
| 5,319,259 A | 6/1994 | Merrill |
| 5,345,112 A | 9/1994 | Nazarian et al. |
| 5,347,183 A | 9/1994 | Phelan |
| 5,362,997 A | 11/1994 | Bloker |
| 5,365,118 A | 11/1994 | Wilcox |
| 5,373,199 A | 12/1994 | Shichinohe et al. |
| 5,381,061 A | 1/1995 | Davis |
| 5,381,370 A | 1/1995 | Lacey et al. |
| 5,382,847 A | 1/1995 | Yasuda |
| 5,383,157 A | 1/1995 | Phelan |
| 5,399,920 A | 3/1995 | Van Tran |
| 5,424,629 A | 6/1995 | Fujiwara et al. |
| 5,444,397 A | 8/1995 | Wong et al. |
| 5,444,406 A | 8/1995 | Horne |
| 5,446,867 A | 8/1995 | Young et al. |
| 5,448,182 A | 9/1995 | Countryman et al. |
| 5,457,407 A | 10/1995 | Shu et al. |
| 5,467,464 A | 11/1995 | Oprescu et al. |
| 5,469,558 A | 11/1995 | Lieberman et al. |
| 5,489,858 A | 2/1996 | Pierce et al. |
| 5,512,854 A | 4/1996 | Park |
| 5,514,979 A | 5/1996 | Collins et al. |
| 5,514,994 A | 5/1996 | Sawada |
| 5,528,166 A | 6/1996 | Iikbahar |
| 5,559,447 A | 9/1996 | Rees |
| 5,561,792 A | 10/1996 | Ganapathy |
| 5,565,794 A | 10/1996 | Porter |
| 5,583,457 A | 12/1996 | Horiguchi et al. |
| 5,587,678 A | 12/1996 | Dijkmans |
| 5,606,275 A | 2/1997 | Farhang et al. |
| 5,656,571 A | 8/1997 | Miller et al. |
| 5,692,165 A | 11/1997 | Jeddeloh et al. |
| 5,717,343 A | 2/1998 | Kwong |
| 5,726,589 A | 3/1998 | Cahill et al. |
| 5,732,027 A | 3/1998 | Arcoleo et al. |
| 5,781,034 A | 7/1998 | Rees et al. |
| 5,828,262 A | 10/1998 | Rees |
| 5,874,838 A | 2/1999 | Rees |
| 5,877,647 A | 3/1999 | Vajapey et al. |
| 5,894,241 A | 4/1999 | Rees |
| 5,898,321 A | 4/1999 | Ilkbahar |
| 5,917,335 A | 6/1999 | Rees ............................. 326/27 |
| 6,064,244 A | 5/2000 | Wakayama et al. |
| 6,166,563 A | 12/2000 | Volk et al. |
| 6,225,819 B1 | 5/2001 | Rees et al. .................. 326/30 |
| 6,307,424 B1 | 10/2001 | Lee |
| 6,384,621 B1 | 5/2002 | Gibbs et al. .................. 326/30 |
| 6,426,651 B1 | 7/2002 | Mandal et al. |
| 6,541,996 B1 | 4/2003 | Rosefield et al. |
| 6,573,746 B2 | 6/2003 | Kim et al. |
| 6,734,702 B1 | 5/2004 | Ikeoku et al. |
| 6,762,620 B2 | 7/2004 | Jang et al. |
| 6,815,979 B2 | 11/2004 | Ooshita |
| 6,836,143 B2 | 12/2004 | Song |
| 7,038,486 B2 | 5/2006 | Aoyama et al. |
| 7,084,662 B1* | 8/2006 | Om et al. ..................... 326/30 |
| 7,332,904 B1* | 2/2008 | Menkus et al. ............ 324/158.1 |
| 7,479,800 B1* | 1/2009 | Vullaganti et al. .......... 326/30 |
| 2004/0017220 A1 | 1/2004 | To et al. |
| 2004/0021481 A1 | 2/2004 | Ohno |
| 2005/0040845 A1 | 2/2005 | Park |
| 2006/0158213 A1* | 7/2006 | Allan ........................... 326/30 |

FOREIGN PATENT DOCUMENTS

| | | |
|---|---|---|
| EP | 0046498 A1 | 3/1982 |
| EP | 0129661 A1 | 2/1985 |
| EP | 0315473 A2 | 5/1989 |
| EP | 317271 A2 | 5/1989 |
| EP | 443435 B1 | 10/1995 |
| JP | 52-35570 A1 | 3/1977 |
| JP | 53-125753 A1 | 11/1978 |
| JP | 59-16424 A1 | 1/1984 |

OTHER PUBLICATIONS

Notice of Allowance for U.S. Appl. No. 11/540,831, dated Sep. 12, 2008.
USPTO Final Rejection for U.S. Appl. No. 11/540,83 dated Jun. 2, 2008; 8 pages.
USPTO Non-Final Rejection for U.S. Appl. No. 11/540,831 dated Nov. 29, 2007; 8 pages.
U.S. Appl. No. 10/773,816: Variable Impedance Output Driver, Om et al., filed on Feb. 6, 2004; 28 pages.
USPTO Notice of Allowance for U.S. Appl. No. 10/773,816 dated Mar. 21, 2006; 6 pages.
USPTO Non-Final Rejection for U.S. Appl. No. 10/773,816 dated Nov. 30, 2005; 7 pages.
USPTO Non-Final Rejection for U.S. Appl. No. 10/773,816 dated Jul. 26, 2005; 7 pages.
U.S. Appl. No. 11/138,823: "Impedance Buffer and Method," Derek Yang, filed on May 26, 2005; 23 pages.
USPTO Non-Final Rejection for U.S. Appl. No. 11/138,823 dated Dec. 4, 2008; 7 pages.
USPTO Final Rejection for U.S. Appl. No. 11/138,823 dated Jun. 25, 2008; 9 pages.
USPTO Non-Final Rejection for U.S. Appl. No. 11/138,823 dated Dec. 21, 2007; 7 pages.
USPTO Final Rejection for U.S. Appl. No. 11/138,823 dated Sep. 25, 2007; 8 pages.
USPTO Non-Final Rejection for U.S. Appl. No. 11/138,823 dated Jun. 4, 2007; 6 pages.
USPTO Non-Final Rejection for U.S. Appl. No. 11/138,823 dated Jan. 18, 2007; 17 pages.
USPTO Notice of Allowance for U.S. Appl. No. 08/837,782 dated Jan. 20, 1999; 3 pages.
USPTO Non-Final Rejection for U.S. Appl. No. 08/837,782 dated Nov. 16, 1998; 5 pages.
USPTO Notice of Allowance for U.S. Appl. No. 09/790,372 dated Dec. 10, 2001; 4 pages.
USPTO Notice of Allowance for U.S. Appl. No. 09/040,033 dated Dec. 15, 2000; 1 page.
USPTO Final Rejection for U.S. Appl. No. 09/040,033 dated Oct. 3, 2000; 7 pages.
USPTO Non-Final Rejection for U.S. Appl. No. 09/040,033 dated May 9, 2000; 6 pages.
USPTO Final Rejection for U.S. Appl. No. 09/040,033 dated Dec. 23, 1999; 9 pages.
USPTO Non-Final Rejection for U.S. Appl. No. 09/040,033 dated Aug. 17, 1999; 8 pages.
Sonoda, "MOSFET Powering Circuit," IBM Technical Disclosure Bulletin, vol. 13, No. 9; 1971, pp. 2658; 1 page.
Harroun, "Bootstrap Inverter Driver," IBM Technical Disclosure Bulletin, vol. 19, No. 3; 1976, pp. 827-828; 2 pages.
"Bufferized ECL-Type Logic Circuit," IBM Technical Disclosure Bulletin, vol. 33, No. 4; 1990, pp. 343-344; 2 pages.
Lewis at al., "Bootstrapped FET Driver," IBM Technical Disclosure Bulletin, vol. 18, No. 11; 1976; 2 pages.
Weste et al., "CMOS VLSI Design: A System Perspective," Addison-Wesley, 1998, pp. 55-56; 2 pages.
"9-Mb Pipelined SRAM with QDR Architecture," CY7C1302V25, Mar. 28, 2000, pp. 1-21; 21 pages.
Gabara at al., "Digitally Adjustable Resistors in CMOS for High-Performance Applications," IEEE Journal of Solid-State Circuits, vol. 2, No. 8, Aug. 1992, pp. 1176-1185; 10 pages.
Kalter at al., "Field-Effect Transistor Driver Circuit," IBM Technical Disclosure Bulletin, vol. 18, No. 4, Sep. 1975, pp. 1028-1029; 2 pages.
USPTO Non-Final Rejection for U.S Appl. No. 08/341,371 dated May 17, 1995; 2 pages.
USPTO Notice of Allowance for U.S. Appl. No. 08/664,061 dated Mar. 6, 1998; 1 page.
USPTO Non-Final Rejection for U.S. Appl. No. 08/664,061 dated Sep. 8, 1997; 4 pages.
USPTO Notice of Allowance for U.S. Appl. No. 08/680,288 dated Feb. 4, 1998; 3 pages.
USPTO Non-Final Rejection for U.S. Appl. No. 08/680,288 dated Jul. 14, 1997; 6 pages.
USPTO Notice of Allowance for U.S. Appl. No. 08/723,077 dated May 22, 1998; 2 pages.
USPTO Non-Final Rejection for U.S. Appl. No. 08/723,077 dated Jan. 16, 1998; 5 pages.
USPTO Requirement for Restriction for U.S. Appl. No. 08/723,077 dated Oct. 10, 1997; 3 pages.
USPTO Notice of Allowance for U.S. Appl. No. 08/723,076 dated Oct. 8, 1998; 6 pages.
USPTO Advisory Action for U.S. Appl. No. 08/723,076 dated Aug. 19, 1998; 2 pages.
USPTO Final Rejection for U.S. Appl. No. 08/723,076 dated Apr. 1, 1998; 6 pages.
USPTO Non-Final Rejection for U.S. Appl. No. 08/723,076 dated Sep. 24, 1997; 8 pages.
USPTO Requirement for Restriction for U.S. Appl. No. 08/723,076 dated Jul. 2, 1997; 5 pages.
USPTO Notice of Allowance for U.S. Appl. No. 08/341,371 dated Feb. 13, 1996; 2 pages.
USPTO Notice of Allowance for U.S. Appl. No. 08/777,488 dated May 27, 1997; 1 page.
USPTO Non-Final Rejection for U.S. Appl. No. 08/777,488 dated Apr. 14, 1997; 3 pages.
USPTO Notice of Allowance for U.S. Appl. No. 09/006,772 dated Sep. 28, 1998; 2 pages.
USPTO Non-Final Rejection for U.S. Appl. No. 09/006,772 dated May 18, 1998; 7 pages.
Griffin et al., Memory 1996: Complete Coverage of DRAM, SRAM, EPROM, and Flash Memory ICs, Chapter 7, "DRAM Technology," pp. 7-1 through 7-20, Integrated Circuit Engineering Corporation, 1996; 22 pages.
Griffin et al., Memory 1996: Complete Coverage of DRAM, SRAM, EPROM, and Flash Memory ICs, Chapter 8, "SRAM Technology," pp. 8-1 though 8-18, Integrated Circuit Engineering Corporation, 1996; 20 pages.
Cypress Semiconductor, "Programmable Skew Clock Buffer (PSCB)," 1995, pp. 10-130 through 10-139; 13 pages.
USPTO Notice of Allowance for U.S. Appl. No. 07/007,957 dated Jul. 5, 1988; 3 pages.
USPTO Non-Final Rejection for U.S. Appl. No. 07/007,957 dated 11/3011987; 3 pages.
USPTO Notice of Allowance for Application No. 07/298,472 dated Jan. 3, 1990; 1 page.
USPTO Non-Final Rejection for U.S. Appl. No. 07/298,472 dated Oct. 17, 1989; 2 pages.
USPTO Notice of Allowance for U.S. Appl. No. 07/675,021 dated Nov. 5, 1991; 2 pages.
USPTO Non-Final Rejection for U.S. Appl. No. 07/675,021 dated Jul. 2, 1991; 5 pages.
USPTO Notice of Allowance for U.S. Appl. No. 07/682,571 dated Jun. 15, 1992; 1 page.
USPTO Final Rejection for U.S. Appl. No. 07/682,571 dated Mar. 26, 1992; 4 pages.
USPTO Non-Final Rejection for U.S. Appl. No. 07/682,571 dated Dec. 2, 1991; 4 pages.
USPTO Notice of Allowance for U.S. Appl. No. 07/956,794 dated Mar. 17, 1994; 1 page.
USPTO Non-Final Rejection for U.S. Appl. No. 07/956,794 dated Sep. 7, 1993; 3 pages.
USPTO Notice of Allowance for U.S. Appl. No. 08/103,449 dated Jul. 26, 1994; 1 page.
USPTO Non-Final Rejection for U.S. Appl. No. 08/103,449 dated Mar. 10, 1994; 4 pages.
USPTO Notice of Allowance for U.S. Appl. No. 08/111,164 dated Jul. 12, 1994; 3 pages.
USPTO Non-Final Rejection for U.S. Appl. No. 08/111,164 dated Mar. 23, 1994; 3 pages.
Fitzgerald et al., "Memory System with High-Performance Word Redundancy," IBM Technical Disclosure Bulletin, vol. 19, No. 5, pp. 1638-1639, Oct. 1976; 2 pages.

Sweha et al., "A 29ns 8Mb EPROM with Dual Reference-Column ATD Sensing," IEEE International Solid-State Circuits Conference Digest of Technical Papers, pp. 264-265, Feb. 1991; 3 pages.

USPTO Notice of Allowance for U.S. Appl. No. 07/945,705 dated Mar. 30, 1994; 1 page.

USPTO Non-Final Rejection for U.S. Appl. No. 07/945,705 ated Oct. 15, 1993; 9 pages.

Mano, "Computer Engineering: Hardware Design," Prentice Hall, 1988, pp. 96-99; 4 pages.

USPTO Notice of Allowance for U.S. Appl. No. 06/886,835 dated Aug. 14, 1987; 1 page.

USPTO Ex Parte Quayle Action for U.S. Appl. No. 06/886,835 dated May 20, 1987; 2 pages.

USPTO Non-Final Rejection for U.S. Appl. No. 06/886,835 dated Jan. 2, 1987; 3 pages.

USPTO Notice of Allowance for U.S. Appl. No. 07/991,568 dated May 20, 1994; 1 page.

USPTO Final Rejection for U.S. Appl. No. 07/991,568 dated Feb. 1, 1994; 5 pages.

USPTO Non-Final Rejection for U.S. Appl. No. 07/991,568 dated Oct. 5, 1993; 5 pages.

USPTO Notice of Allowance for U.S. Appl. No. 07/246,634 dated Aug. 14, 1989; 1 page.

USPTO Non-Final Rejection for U.S. Appl. No. 07/246,634 dated Jun. 19, 1989; 3 pages.

Cypress Semiconductor, "Cypress Data Book Memories DataCom FCT Logic PC Products," May 1995, pp. i-vii, 2-36 through 2-43, 2-227, 2-258 through 2-268, 6-1 through 6-15, and 6-74 though 6-84; 54 pages.

USPTO Notice of Allowance for U.S. Appl. No. 08/576,081 dated Jan. 31, 2000; 1 page.

USPTO Non-Final Rejection for U.S. Appl. No. 08/576,081 dated Sep. 14, 1999; 7 pages.

USPTO Advisory Action for U.S. Appl. No. 08/576,081 dated Jul. 28, 1999; 1 page.

USPTO Final Rejection for U.S. Appl. No. 08/576,081 dated Apr. 12, 1999; 13 pages.

USPTO Non-Final Rejection for U.S. Appl. No. 08/576,081 dated Oct. 19, 1998; 9 pages.

USPTO Advisory Action for U.S. Appl. No. 08/576,081 dated Jul. 31, 1998; 1 page.

USPTO Final Rejection for U.S. Appl. No. 08/576,081 dated Apr. 22, 1998; 7 pages.

USPTO Non-Final Rejection for Application No. 08/576,081 dated Oct. 1, 1997; 6 pages.

USPTO Notice of Allowance for U.S. Appl. No. 08/228,927 dated Apr. 21, 1995; 2 pages.

USPTO Non-Final Rejection for U.S. Appl. No. 08/228,927 dated Jul. 19, 1994; 4 pages.

USPTO Notice of Allowance for U.S. Appl. No. 09/006,772 dated Sep. 28, 1998; 2 pages.

USPTO Non-Final Rejection for U.S. Appl. No. 09/006,772 dated May 18, 1998; 7 pages.

USPTO Notice of Allowance for U.S. Appl. No. 06/683,062 dated Jul. 25, 1986; 4 pages.

USPTO Non-Final Rejection for U.S. Appl. No. 06/683,062 dated Feb. 18, 1986; 5 pages.

USPTO Notice of Allowance for U.S. Appl. No. 08/341,371 dated Feb. 13, 1996; 2 pages.

USPTO Non-Final Rejection for U.S. Appl. No. 08/341,371 dated May 17, 1995; 6 pages.

USPTO Notice of Allowance for U.S. Appl. No. 11/510,347 dated Apr. 15, 2010; 4 pages.

USPTO Non-Final Rejection for U.S. Appl. No. 11/510,347 dated Dec. 10, 2009; 10 pages.

USPTO Advisory Action for U.S. Appl. No. 11/510,347 dated Nov. 2, 2009; 3 pages.

USPTO Final Rejection for U.S. Appl. No. 11/510,347 dated Aug, 26, 2009; 11 pages.

USPTO Non-Final Rejection for U.S. Appl. No. 11/510,347 dated Mar. 19, 2009; 8 pages.

USPTO Non-Final Rejection for U.S. Appl. No. 11/510,347 dated Sep. 26, 2008; 9 pages.

USPTO Miscellaneous Action with SSP for U.S. Appl. No. 11/510,347 dated Mar. 15, 2007; 1 page.

* cited by examiner

FIG. 7 (POSITIVE OFFSET CASE)

FIG. 8 (NEGATIVE OFFSET CASE)

| Parameter | Worst Case Error | Worst Case Error | Worst Case Error | Improvement | % Savings in the Error Budget |
|---|---|---|---|---|---|
| | Background Art #1 | Background Art #2 | New Architecture | | |
| PU-RQ | 2LSB + offset | 2LSB -offset | 1LSB + Offset | ~ 1LSB | 42.5 |
| PD-RQ | 2LSB + offset | 3LSB -offset | 1LSB + Offset | 1LSB | 42.5 |
| PU-PD | 2LSB | 3LSB+2*offet | 1LSB | 1LSB | 50 |

FIG. 9

| Parameter | Worst Case Error Background Art #1 | Worst Case Error Background Art #2 |
|---|---|---|
| PU-RQ | 2LSB + offset | 2LSB -offset |
| PD-RQ | 2LSB + offset | 3LSB -offset |
| PU-PD | 2LSB | 3LSB+2*offet |

FIG. 15 (BACKGROUND ART)

VARIABLE IMPEDANCE SENSE ARCHITECTURE AND METHOD

This application claims the benefit of U.S. provisional patent application Ser. No. 60/728,476 filed on Oct. 20, 2005, the contents of which are incorporated by reference herein.

TECHNICAL FIELD

The present invention relates generally to input/output (I/O) circuits, and more particularly to I/O circuits that can provide impedance matching that takes into account drifts in impedance arising from changes in operating conditions.

BACKGROUND OF THE INVENTION

Integrated circuits and other electronic devices can include input and/or output (I/O) connections for transmitting and receiving signals. As signal transmission speeds have increased, impedance matching has become an increasingly important feature in such devices. Matching impedance with external package and/or circuit board traces can improve the signal integrity and performance of both a signal transmitter and receiver.

In order to match signal line impedance, I/O circuits can include variable impedance circuits that can be adjusted as needed to match a sensed reference impedance value. Such circuits typically include a pull-up array of impedance devices (e.g., resistors) and/or a pull-down array of impedance devices (e.g., resistors). By selectively enabling such impedance devices, the impedance presented at the I/O can be calibrated to provide a target impedance.

One circuit that can be used in calibrating I/Os is a variable impedance sense (VIS) circuit. A VIS circuit can be used in I/O circuits to match the impedance of pull-up and pull-down arrays to an impedance of an external trace by sensing the resistance of an external reference impedance (e.g., reference resistor). The accuracy of impedance sense and matching circuit can be limited by the architecture and various error sources.

To better understand various features of the disclosed embodiments, a conventional VIS circuit will now be described with reference to FIG. 11 (BACKGROUND ART #1).

A VIS circuit 1100 can include an external calibrating resistor RQ that is utilized to calibrate pull-up (PU) arrays 1102-0 and 1102-1, as well as a pull-down (PD) array 1104. PU arrays (1102-0 and 1102-1) and PD array 1104 are understood to be replicas of PU and PD arrays of actual I/O circuits (not shown) for which impedance matching is employed.

Each PU array and PD array can be composed of several pull-up and pull-down legs arranged in parallel. Each leg can represent a unit resistance, which can be established by a combination of transistors and/or a resistor, for example. An impedance of a PU array or PD array can be set by turning on the appropriate number of legs in parallel. FIG. 11 shows a digital count value (pu_dac[k:0] and pd_dac[k:0]) for both PU and PD arrays, respectively.

The VIS circuit 1100 also shows a switch circuit 1106. A switch circuit 1106 can selectively connect a reference voltage Vref or a voltage generated by PU/PD arrays 1102-1/1104 to one input (−) of a high gain comparator 1108 and a voltage generated by PU arrays 1102-0/RQ to another input (+) of the comparator 1108. The switch circuit 1106 shown includes two switch elements PD_EN and PU_EN.

Comparator 1108 has an output connected to a comparator register 1110. A comparator register 1110 can store an output value generated by comparator 1108.

The VIS circuit 1100 of FIG. 11 includes a calibration loop 1112 for a PU array as well as a calibration loop 1114 for a PD array. Further, the VIS circuit 1100 generates impedance matching values utilizing a successive approximation register (SAR) technique, and so includes SAR/counters (SAR/Counter) 1116-0 and 1116-1 for both such loops (1112 and 1114). A resulting value generated in the SAR/Counters 1116-0 and 1116-1 can be stored in update registers 1118-0 and 1118-1, respectively.

As is well understood, in a successive approximation technique, a "most" significant impedance leg can be switched into the circuit to create a voltage divider in combination with a reference impedance (e.g., RQ). A resulting voltage generated can be compared against a reference voltage. If the voltage is greater than the reference voltage (as determined by a comparator) a most significant bit can be set to a particular value (e.g., 1 or 0). In a following cycle, a next significant impedance leg can be switched into the circuit to determine the value of the next most significant bit. This can continue until a final code is generated.

In the arrangement of FIG. 11, SAR/Counters (1116-0 and 1116-1) can operate as successive approximation registers or as up/down counters based on the mode of operation and the comparator output. The particular mode of operation can be established by control block 1120.

In an initial calibration cycle, a control block 1120 operates SAR/Counters (1116-0 and 1116-1) as successive approximation registers. However, in an update cycle (described in more detail below), SAR/Counters (1116-0 and 1116-1) can operate as up and/or down counters.

Final codes generated by VIS circuit 1100 (pucode[k:1] and pdcode[k:1]) can be provided to other I/O circuits via final update registers 1122-0 and 1122-1. As shown in FIG. 11, final codes (pu_dac[k:1] and pd_dac[k:1]) can be generated by dropping a least significant bit (pu_dac[0] and pd_dac[0]) of a code stored in update registers 1118-0 and 1118-1, respectively.

The operation of the conventional VIS circuit 1100 will now be described.

A VIS circuit 1100 can be conceptualized as including two closed loops; one for the PU array calibration 1112 and another for the PD array calibration 1114. Each loop can include a resistive voltage divider digital-to-analog converter (DAC) and analog-to-digital converter (ADC). In the case of PU loop 1112, the DAC is formed by PU array 1102-0, which receives a digital code (pu_dac[k:0]), and reference resistor RQ, and provides a resulting analog voltage on reference node 1124. In the case of PD loop 1114, the DAC is formed by PU array 1102-1, which receives a digital code (pu_dac[k:0]) and PD array 1104, which receives a digital code (pd_dac[k:0]), and provides a resulting analog voltage on reference node 1126.

In the case of PU loop 1112, the ADC is an SAR type ADC formed by comparator 1108, comparator register 1110, and SAR/Counter 1116-0, as controlled by control block 1120. Similarly, in the case of PD loop 1114, the ADC is an SAR type ADC formed by comparator 1108, comparator register 1110, and SAR/Counter 1116-1, as controlled by control block 1120.

In a calibration of the PU loop 1112, VIS circuit 1100 can determine a binary output code (pucode[k:1]) for PU arrays in the device by calibrating PU array 1102-0 against external reference resistor RQ. In a calibration of PD loop 1114, VIS circuit 1100 can determine a binary output code (pdcode[k:1])

for PD arrays in the device by calibrating PD array 1104 against an already calibrated PU array 1102-1. That is, once a calibrated pull-up code (pu_dac[k:0]) has been generated, such a code can be applied to PU array 1102-1, to enable it to act as a reference resistor for PD array 1104.

Initially, a PU loop 1112 can be enabled and a PD loop 1114 can be disabled. In such a state, switch element PU_EN can be closed (i.e., low impedance) and switch element PD_EN can be open (i.e., high impedance). An output of the PU voltage divider (1102-0/RQ) on reference node 1124 can be connected to a positive terminal of comparator 1108 and a reference voltage (Vref) can be connected to a negative terminal of comparator 1108. Resulting outputs of the comparator C1 can be used by SAR/Counter 1116-0 in an SAR type binary search algorithm to determine binary output code for the PU array (pu_dac[k:0]). In such an operation, comparator 1108 and SAR/Counter 1116-0 can act as an SAR ADC, which quantizes the analog input (output of the PU voltage divider) one bit (e.g., reference resistor leg) at a time. For each bit (starting from the MSB of pu_dac[k:0]), the ADC turns on the bit and checks the output of the DAC (PU voltage divider). If the output of comparator 1108 is HIGH, the bit can be turned off and the next bit can be turned on. If the output of comparator 1108 is LOW, a bit can be left on and the next bit can be turned on. This process can be repeated until all (in this case k+1) bits of the pull-up binary code (pu_dac[k:0]) have been determined. A final pull-up binary code can represent the number of pull-up legs required to match the impedance of PU array 1102-0 to the external resistor RQ.

Once PU array 1102-0 has been calibrated, the resulting code stored in update register 1118-0 can be output to reference PU array 1102-1, and PU loop 1112 can be disabled. Subsequently, PD loop 1114 can be enabled and the same procedure (SAR technique) can be used to calibrate PD array 1104. Accordingly, switch PD_EN can be closed and switch PU_EN can be open. An output of the PD voltage divider (1102-1/1104) at reference node 1126 can be connected to a negative terminal of comparator 1108 and node 1124 can be connected to a positive terminal of comparator 1108. A final pull-down binary code (pd_dac[k:0]) can be stored in update register 1118-1, and can represent the total number of pull-down legs required to match the impedance of PD array 1104 to calibrated PU array 1102-1. This can complete an initial calibration cycle.

However, while one set of calibration codes can provide an initial impedance match for I/Os of a device, operating conditions can result in changes (i.e., drift) in circuit components. In order to account for the variations in temperature and voltage the pull-up and pull-down binary output codes (pu_dac [k:0] and pd_dac [k:0]) can be updated every "P" number of clock cycles. Such updates can be 1 bit updates that introduce a maximum of 1 LSB in either an up direction (increment) or down direction (decrement). Such an operation can be an update cycle or update mode operation.

Referring still to FIG. 11, during an update mode operation, an SAR/Counter (1116-0 and/or 1116-1) can operate as an up-down counter according to an output of comparator 1108. A PU array 1102-0 can be updated first, with a resulting code being applied to PU array 1102-1. A PD array 1104 can then be updated. In more detail, during an update operation of a PU array 1102-0, if an output of comparator 1108 is '1', indicating that there has been some decrease in the impedance of the PU array 1102-0, pull-up binary code (pu_dac[k:0]) can be decremented by 1. Conversely, if an output of comparator 1108 is '0', indicating an increase in the impedance of PU array 1102-0, pull-up binary code (pu_dac[k:0]) can be incremented by 1. Once a pull-up binary code is updated, a pull-down binary code (pd_dac[k:0]) can be updated in the same general way. Such codes values can then be forwarded to actual I/Os of the device.

As noted briefly above, the arrangement of FIG. 11 shows an example in which a binary output code of k+1 bits is generated, but only k such bits are used as values to provide impedance matching at actual I/Os. That is, an LSB bit of binary output codes (pu_dac [k:0] and pd_dac [k:0]) can be dropped and the remaining k bits (pu_dac[k:1] and pd_dac [k:1] are stored in final update registers (1122-0 and 1122-1) and then provided to I/O driver circuits.

The dropping of an LSB can occur in order to reduce noise in a VIS circuit 1100. In the case of frequent update cycles, and especially for continuous updates (updates at every clock cycle), an LSB bit within each output code can toggle every update cycle (even if there is no significant temperature or voltage variation). Such a bit can be called a "chatter" bit. A chattering of an LSB bit can cause significant noise in a driver circuit and adversely affect its performance.

Accordingly, in cases where the noise due to the chattering bit dominates the accuracy gained by the 1 LSB, the LSB bit can be dropped and the remaining bits can be utilized to match impedance of actual I/O driver circuits. This can be the same as the I/O driver circuits getting all the bits, but with the last bit (LSB) being always '0' (turned OFF). In FIG. 11, an LSB bit can be dropped only on a final code that is forwarded to I/O driver circuits and not on the code inside the VIS circuit. Thus, dropping of an LSB bit can have no effect on the general operation of the operation of calibration loops 1112 and 1114.

The conventional approach shown in FIGS. 11 and 14 is disclosed in commonly-owned co-pending U.S. patent application Ser. No. 11/138,823, filed on May 26, 2005, titled IMPEDANCE BUFFER METHOD, by Derek Yang. The contents of this application are incorporated by reference herein.

The conventional arrangement shown in FIG. 11 can provide advantageously precise matching between a PD array and a reference impedance (RQ). However, such an arrangement can have drawbacks in certain applications. First, matching may not be as precise between a PU array and RQ. Further, an input offset voltage can be a significant source of error in the VIS circuit 1100. In particular, in light of the quantization error introduced by dropping an LSB, the impact of an input offset upon performance can vary according to the polarity of the input offset.

One approach to addressing input offset is shown in commonly-owned co-pending U.S. patent application Ser. No. 11/540,831, filed on Sep. 28, 2006, titled VARIABLE IMPEDANCE SENSE ARCHITECTURE AND METHOD, by Vullaganti et al. One example of this approach is shown in FIGS. 12 and 13 (BACKGROUND ART #2). The contents of this application are incorporated by reference herein.

FIG. 12 is a block schematic diagram of a VIS circuit 1200. The operation of the circuit is shown in FIG. 13. In this particular example, when an input offset has a negative value, a generated SAR binary impedance setting value (code) can be incremented by one. Further, if a resulting incremented code has a LSB of "1", the code can be incremented again prior to the LSB being dropped.

The above arrangement can provide advantageously precise matching between a PU array and a reference impedance (RQ). Further, error rates resulting from an input offset and subsequent quantization resulting from dropping the LSB can be addressed.

Referring now to FIG. 13, a conceptual operation of the VIS circuit of FIG. 12 is shown in a flow diagram. FIG. 13 shows an initial calibration cycle, as well as update operations described above. Within the flow diagram 1300, "STEP B1" refers to implementation of a binary search SAR technique during an initial calibration cycle. STEP B2 refers to the operation of, if needed, further incrementing a code prior to dropping an LSB. STEP B3 represents an up/down counter operation during an update operation. STEP B4 represents the operation of, if needed, further incrementing a code prior to dropping an LSB during an update operation.

While the above approach can provide clear advantages over conventional impedance sensing and matching, even greater improvements are desirable in some applications. In particular, some applications can require matching not only between a line (e.g., trace) impedance, but also a matching between a PU array and PD array. For example, some operational specifications can require that an impedance between a PU array and PD array, with respect to a reference impedance (RQ), be no more than 10%. At the same time, PU array and PD array impedance should vary by no more than 4%.

Thus, while an approach like that of FIGS. 11 and 12 can provide relatively good matching between a PD array and/or PU array to a reference impedance (RQ), such approaches may not meet a required tolerance of impedance matching between a PD array and PU array.

In approaches like those described above, during an update cycle, the compensation mechanism for impedance variations following an initial calibration involves changing the LSB of a code either 1 bit up or 1 bit down based on the output of the comparator. However, such compensation can occur even when there is no significant variation in the impedance, or when the variation is such that the error is actually reduced. Because the architectures like those above simply count 1 LSB up or down based on the output of the comparator, in certain cases an additional error of 1 LSB can be introduced during an update cycle. This is explained in detail below in FIGS. 14A to 14B.

FIG. 14A shows an example of the propagation of a worst-case error during the initial and update mode operations. The figure shows an example in which an input offset is positive. During the update mode operation of pull-down array codes (PD calibration), even when there is no significant variation in the resistance of the PD array, a control block can count one LSB up (see STEPB3). This count-up operation can increase pull-down impedance code error by 1 LSB. Further, a mismatch between a PU array and PD array can be 2 LSB as a result of the update mode operation.

FIG. 14B shows another example for the propagation of the worst-case error during the initial and update mode operations. In this example, pull-up array has a small/negligible variation moving towards the target resistance RQ. A control block can count one LSB down, further increasing the error, even though the variation is actually moving closer to a target resistance RQ. Further, a mismatch between a PU array and PD array can once again be 2 LSB as a result of this update mode operation.

These error rates are summarized in the table of FIG. 15.

BRIEF DESCRIPTION OF THE DRAWINGS

FIG. 9 is a table showing worst case error in a system/method according to an embodiment of the present invention, as well as examples of improvements in error rates that can result.

FIG. 15 is a table showing worst case error results for the conventional VIS circuits of FIGS. 11 and 12.

DETAILED DESCRIPTION

The various embodiments of the present invention are directed to variable impedance sense (VIS) circuits and methods. The disclosed embodiments can address errors that can arise when variable impedance elements are adjusted in response to detected drifts in the variable impedance elements arising from changes in operating conditions, or the like.

Figure 1:
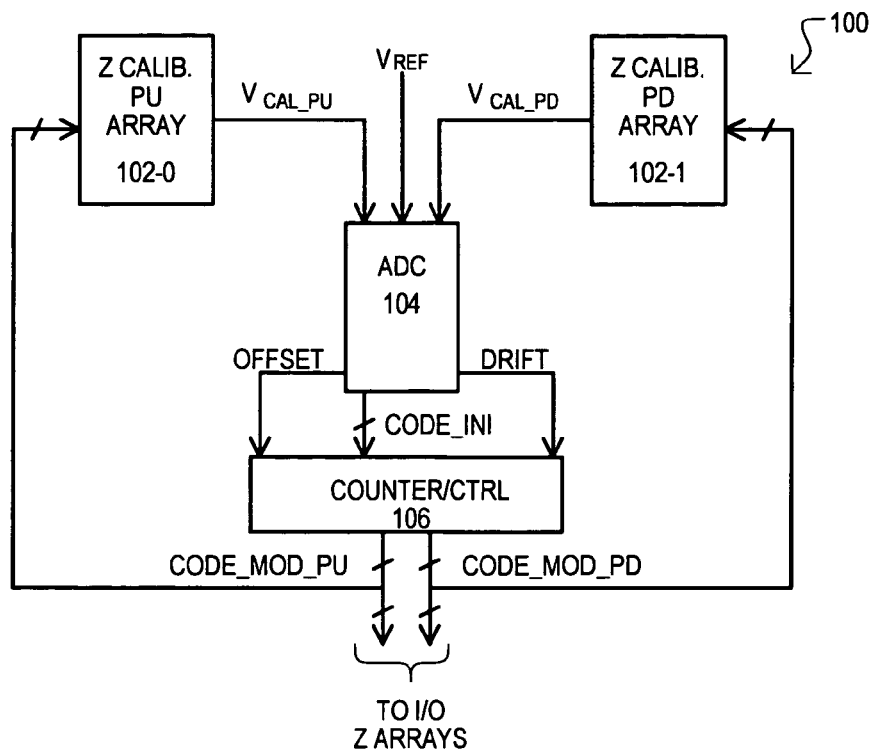
FIG. 1 is a block diagram of a variable impedance sense (VIS) circuit according to a first embodiment of the present invention.

Referring now to FIG. 1, a VIS circuit 100 according to a first embodiment is shown in a block schematic diagram. A VIS circuit 100 can include a pull-up calibration impedance array 102-0 (e.g., variable impedance elements), a pull-down calibration impedance array 102-1 (e.g., variable impedance elements), an analog-to-digital converter (ADC) circuit 104, and a counter/control circuit 106. Impedance (Z) calibration arrays (102-0 and 102-1) can provide variable impedances based on received input codes CODE_MOD_PU and CODE_MOD_PD, respectively.

An ADC circuit 104 can receive calibration voltages ($V_{CAL\_Pu}$ and $V_{CAL\_PD}$) from Z calibration arrays (102-0 and 102-1) and a reference voltage ($V_{REF}$). ADC circuit 104 can generate initial digital code values CODE_INI corresponding to a received calibration voltages ($V_{CAL\_PU}$ or $V_{CAL\_PD}$). Initial code values CODE_INI can be provided to counter/control circuit 106.

Figure 11:
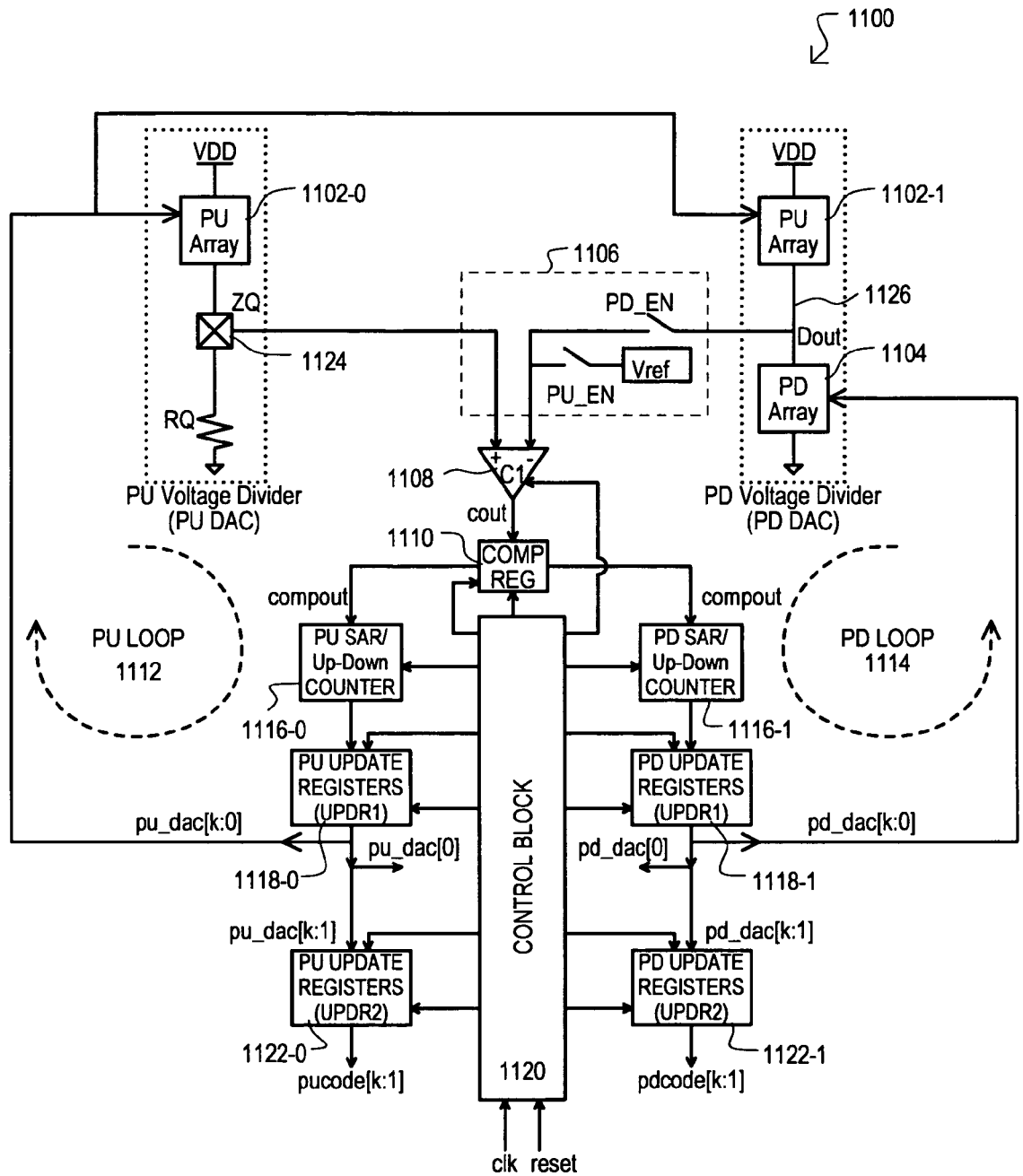
FIG. 11 is a block schematic diagram of a first conventional VIS circuit.
Figure 12:
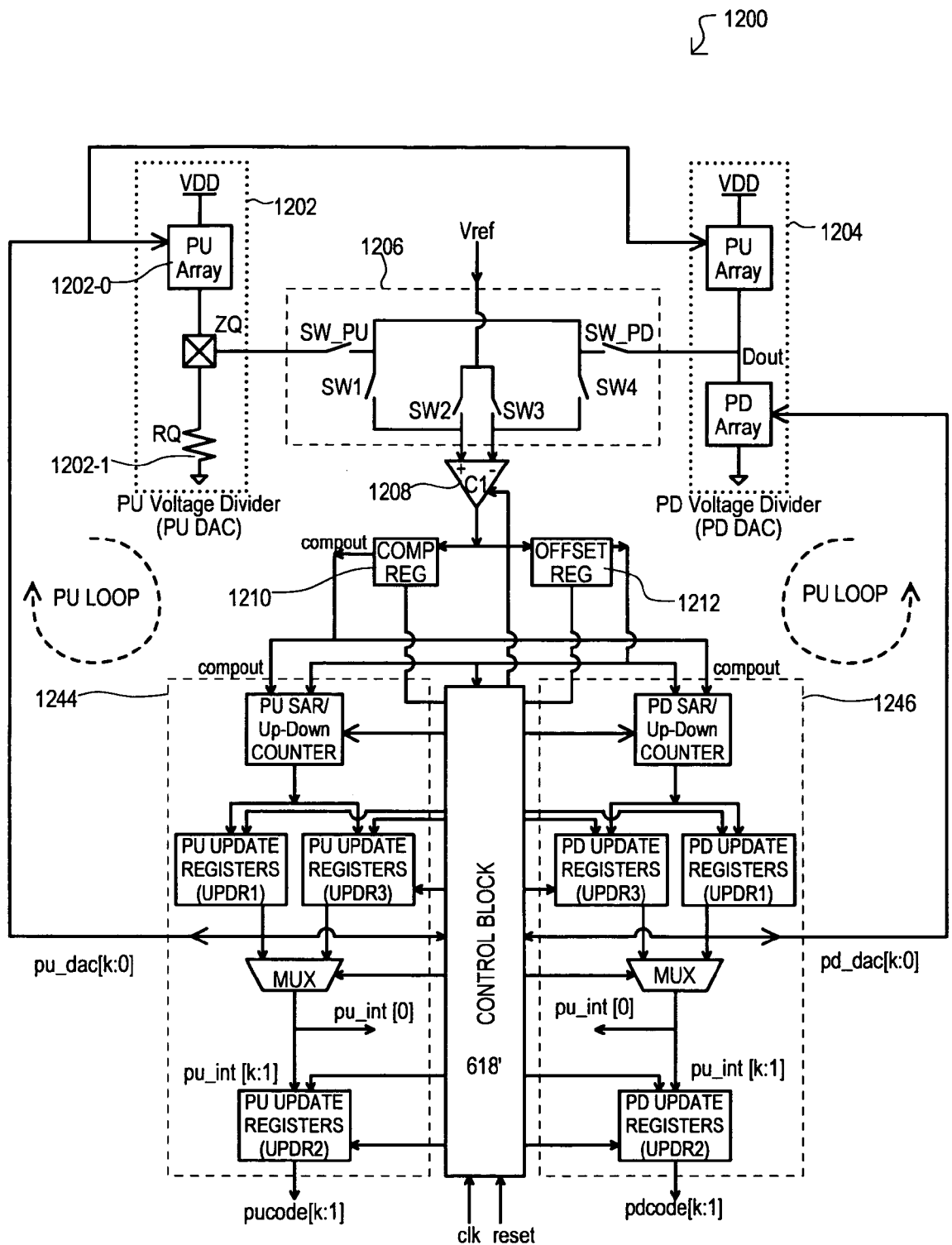
FIG. 12 is a block schematic diagram of a second conventional VIS circuit.
Figure 13:
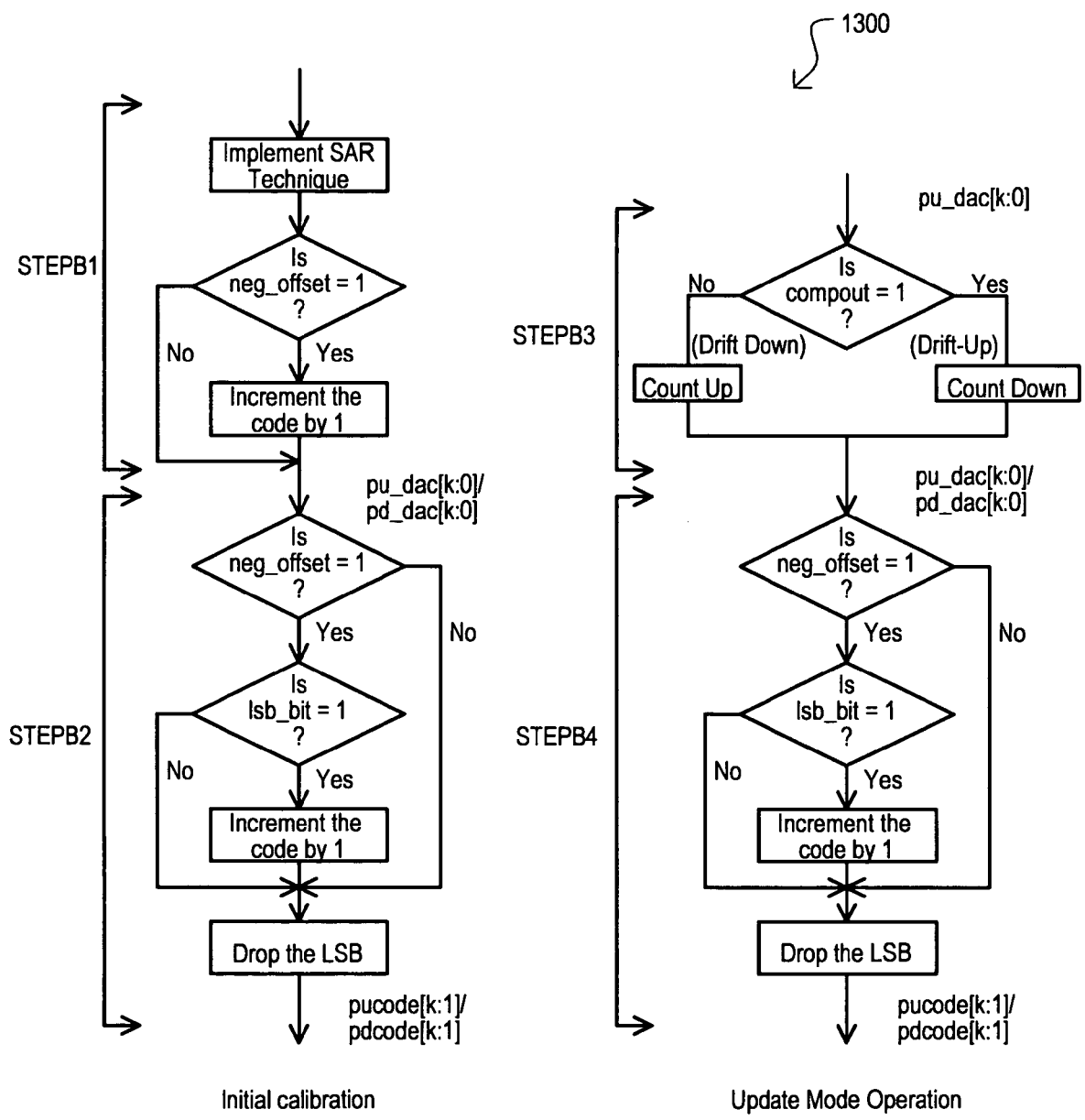
FIG. 13 is a flow diagram of an initial calibration and update operation for the conventional VIS circuit of FIG. 12.
Figure 14A:
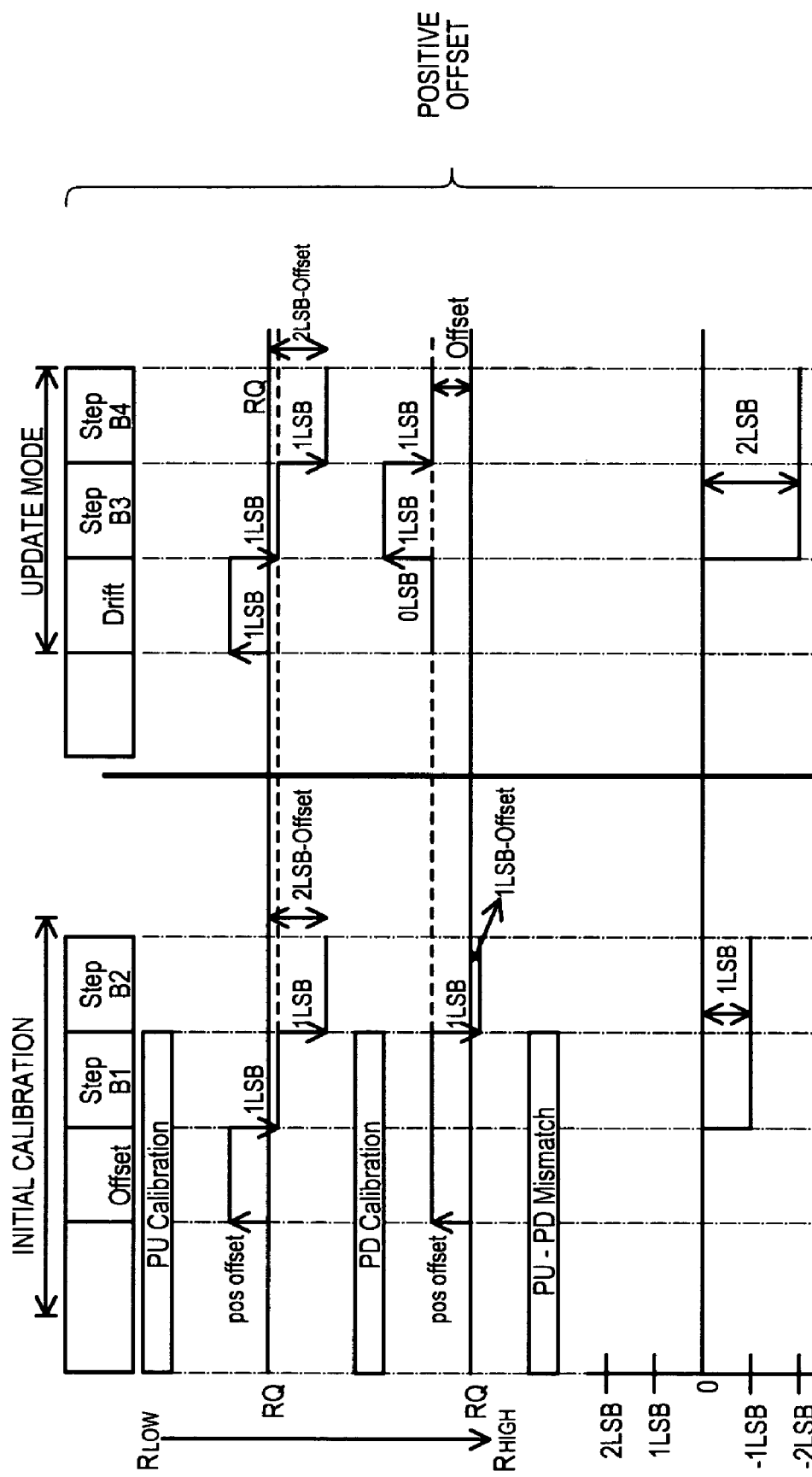
FIG. 14A is a graphical illustration of the propagation of error due to a positive input offset for the conventional VIS circuit of FIG. 12.
Figure 14B:
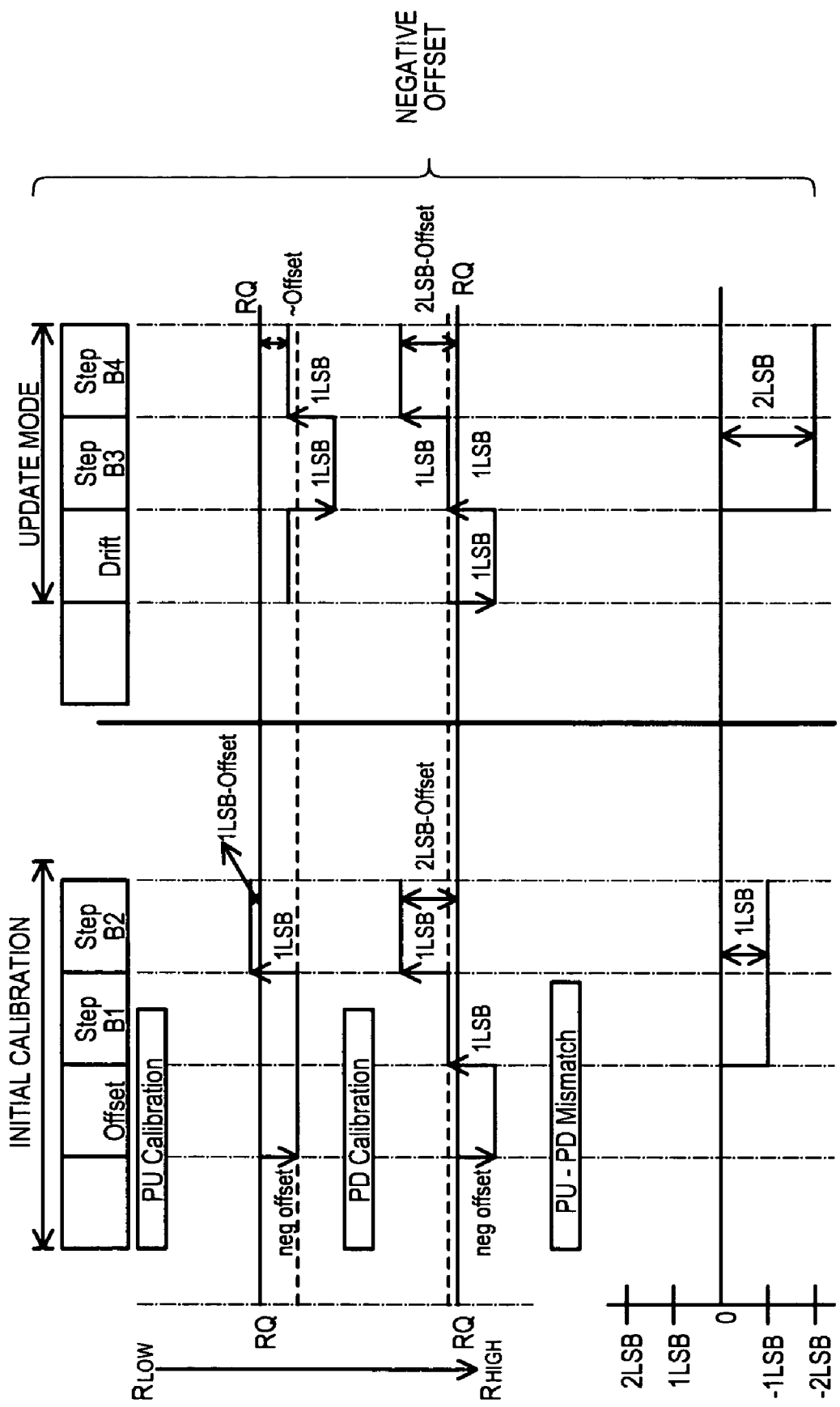
FIG. 14B is a graphical illustration of the propagation of error due to a negative input offset for the conventional VIS circuit of FIG. 12.

Unlike arrangements like those of FIGS. 11 and 12 above, an ADC circuit 104 can provide both an offset value OFFSET as well as a drift value DRIFT to counter/control circuit 106, which can then be used in combination to selectively alter an initial code value CODE_INI. A value OFFSET can represent an offset inherent in an ADC circuit 104. A drift value DRIFT can be a periodically generated value that reflects a detected change in impedance of either of Z calibration arrays (102-0 and/or 102-1).

As noted above, a counter/control circuit 106 can modify an initial code value CODE_INI based on an offset value OFFSET to generate modified codes (CODE_MOD_PU and CODE_MOD_PD). As but one particular example, in an initial calibration, if a value OFFSET has one value, a code (CODE_INI) can be altered only when it has one particular least significant bit (LSB) (e.g., "0" or "1"). However, if a value OFFSET has a different value, a counter circuit 106 can alter CODE_INI regardless of an LSB value. Such an arrangement can establish calibrated code values that compensate for an inherent input offset.

In addition, following the creation of such initial calibrated code values, code values can be selectively adjusted according to both a drift value DRIFT and OFFSET value. This is in contrast to conventional approaches that modify for drift based only on a drift value.

As but one example, a code can be adjusted (modified) based on both a DRIFT value and an OFFSET value. Such an adjusted code can then be examined. If the drift adjustment has moved a code so that the modified pull-up and pull-down codes (CODE_PU_MOD or CODE_PD_MOD) will increase a worst case error, the drift adjustment can be undone (e.g., prevented from taking effect, decremented if previously incremented and vice versa).

In this way, an adjustment to an impedance setting value in response to a detected drift can be introduced only when such an adjustment does not move code values further away from a target value. Furthermore, by modifying codes for both PU and PD arrays in this manner, a matching error between such PU and PD arrays can be reduced over conventional approaches.

Figure 2:
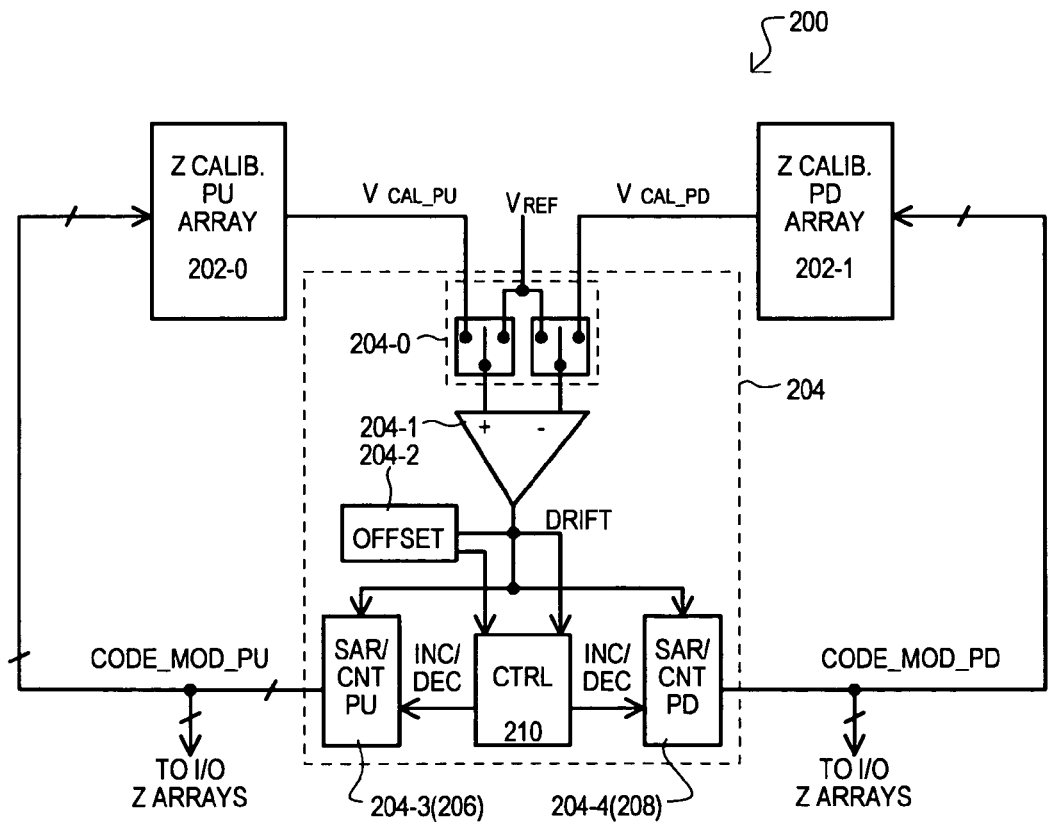
FIG. 2 is a block diagram of a VIS circuit according to a second embodiment of the present invention.

Referring now to FIG. 2, a VIS circuit 200 according to a second embodiment is shown in a block schematic diagram. A VIS circuit 200 can include some of the same general components as a first embodiment 100, thus like sections are referred to by the same reference character but with a first digit being a "2" instead of a "1".

FIG. 2 shows an example in which an ADC circuit 204 can be a successive approximation register (SAR) type ADC circuit. ADC circuit 204 can include a switch circuit 204-0, a comparator 204-1, an offset register 2042, a PU SAR/Counter 204-3, and a PD SAR/Counter 204-4. A control circuit 210 can receive an OFFSET value and a DRIFT value, and in response to such values, can generate, increment and/or decrement code signals for PU/PD SAR/Counters (204-3/4).

In operation, a VIS circuit 200 can first couple a reference voltage ($V_{REF}$) to both inputs of comparator 2041 by operation of switch circuit 204-0, to thereby detect a polarity of any input offset. Such a result can be stored in offset register 2042. A switch circuit 2040 can then switch calibration voltage $V_{CAL\_PU}$ into an input of comparator 2041. SAR techniques can then be used to generate a digital code value representing a reference impedance for Z calibration PU array 202-0. In the same general fashion, calibration voltage $V_{CAL\_PD}$ can be used to generate a digital code for Z calibration PD array 202-1.

Subsequently, a switch circuit 2040 can periodically re-apply calibration voltages ($V_{CAL\_PU}$ and $V_{CAL\_PD}$) and reference voltage Vref to a comparator 204-1 to generate a drift value DRIFT, for detecting a change in the impedance of Z calibration arrays (202-0 and/or 202-1) due to changes in temperature, power supply voltage, or other variations in operating conditions.

According to the previously determined OFFSET value and newly determined DRIFT value, a control circuit 210 can cause SAR/Counters (204-3 and 2044) to increment or decrement their respective digital codes. Even more particularly, a control circuit 210 can selectively cause an incrementing or decrementing of the codes that compensates for an input offset, while at the same time, ensuring that changes to codes (CODE_PU_MOD and CODE_PD_MODE) in response to a DRIFT value do not increase an overall worst case error.

In this way, incremental adjustments to an SAR type generated value due to drift can be implemented only when such changes do not increase the error rate of the circuit. Such an approach can provide accurate matching between a PU/PD arrays and a reference impedance RQ, as well as better matching between PU and PD arrays.

Figure 3:
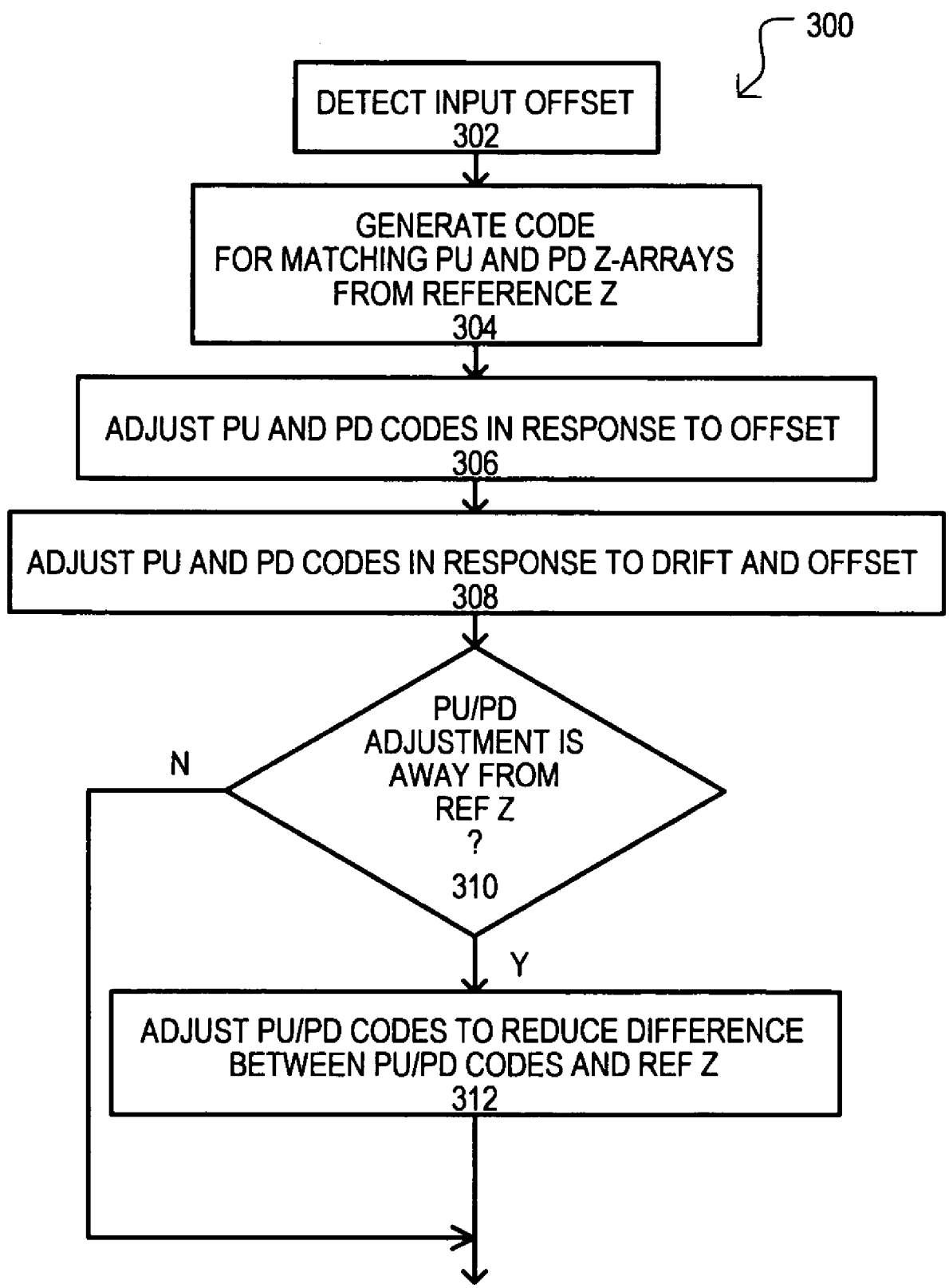
FIG. 3 is a flow diagram of a VIS method according to a third embodiment of the present invention.

While the above embodiments have shown VIS circuits, the present invention can also include methods of variable impedance sensing. One example of such a method is shown in FIG. 3. A method 300 can include detecting an input offset (step 302). As but one example, such a step can include applying a same potential to both inputs of a comparator. Codes can then be generated for PU and PD variable impedance (Z) arrays based on a reference impedance (step 304). Such a step can include any of a number of analog-to-digital conversion techniques, preferably SAR techniques.

PU and PD codes can then be adjusted in response to the detected offset (step 306).

Subsequently, PU and PD codes can be adjusted according to a detected drift in a resistance value as well as an input offset value (step 308). A determination can then be made as to whether such a drift adjustment is away from a reference (e.g., target) impedance (step 310).

If a PU (or PD) adjustment does not shift a variable impedance away from a reference impedance (N from 310), no further adjustment can be made to the codes. However, if a PU (or PD) shifts a variable impedance away from a target impedance (Y from 310), the codes can be adjusted once more to reduce a difference between a resulting variable impedance and the desired target impedance (step 312).

In this way, potential drift adjustments that can contribute to errors in an impedance setting code can be automatically compensated for by altering such codes after discovering the adverse effect of such codes. Further, by adjusting both PU and PD codes in such a manner, greater matching between PU and PD arrays can be achieved.

Figure 4:
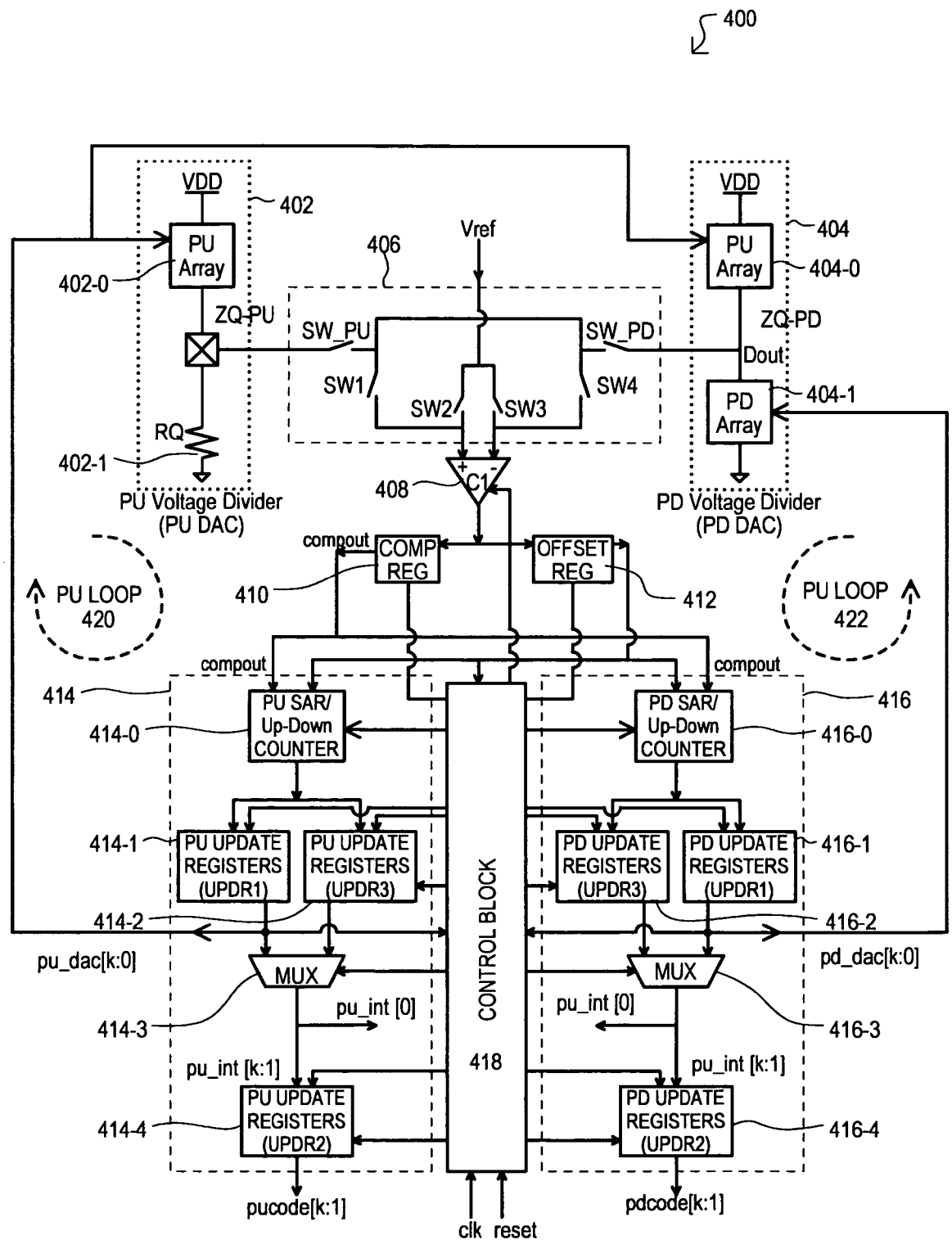
FIG. 4 is a block diagram of a VIS circuit according to a fourth embodiment of the present invention.

Referring now to FIG. 4, a detailed example of a VIS circuit 400 is shown in a block schematic diagram. A VIS circuit 400 can include a pull-up (PU) array section 402, a pull-down (PD) array section 404, a switch section 406, a comparator 408, a comparator register 410, and an offset register 412. In addition, a VIS circuit 400 can include PU circuitry 414 and PD circuitry 416, both of which can be controlled by a control block 418.

A PU loop 420 can be formed by PU array section 402, switch circuit 406, comparator 408, comparator register 410, offset register 412, and PU circuitry 414, as controlled by control block 418. A PD loop 422 can be formed by PD array section 404, switch circuit 406, comparator 408, comparator register 410, offset register 412, and PD circuitry 416, as controlled by control block 418.

A VIS circuit 400 can add a digital correction mechanism based on both the direction of an input offset voltage, as well as the result of a drift correction. Thus, as compared to the conventional approach of FIG. 12, two different cycles can be included: a different offset detection cycle and a different drift adjustment cycle. During a detection cycle, a direction (e.g., polarity) of an input offset can be detected. An input offset voltage can include, but is not necessarily limited to, an input offset at the inputs of comparator 408, an error in a reference voltage Vref, and/or error resulting from an overdrive voltage of the comparator 408.

A value representing the direction of an input offset can be captured in offset register 412. Such a captured input offset value can then be used to control the operation of control block 418. In a subsequent drift adjustment cycle, a drift value generated from comparator 408 can be provided to control the operation of control block 418.

As shown in FIG. 4, PU circuitry 414 can include up-down counter (or counter function(s)) 414-0, a first PU update register 4141, a second PU update register 414-2, a multiplexer (MUX) 414-3, and a final PU update register 4144. Similarly, PD circuitry 416 can include up-down counter (or counter function(s)) 416-0, a first PD update register 416-1, a second PD update register 416-2, a multiplexer (MUX) 416-3, and a final PD update register 4164. As will be described in more detail below, up-down counters (414-0 and 416-0) can execute a number of different functions under control of control block 418 and according to a mode (cycle).

However, it is understood that alternate embodiments can include more than one counter for performing the functions described in conjunction with up-down counters (414-0 and 416-0).

Up-down counters (414-0 and 416-0) can modify a code value to counteract the effect of an input offset and in response to a drift value. In addition, and unlike the above conventional approaches, up-down counters (414-0 and 416-0) can further adjust such count values after taking into account the actual effects of a drift adjustment on variable impedance elements.

The operation of VIS circuit 400 will now be described.

A VIS circuit 400 can execute various operations, including but not limited to an offset detection cycle and a drift detection and adjustment cycle. During such an offset detection cycle, switch elements SW2 and SW3 within switch circuit 406 can be closed (i.e., low impedance state). During the same cycle, switch elements SW1, SW4, SW_PU and SW_PD within switch circuit 406 can be open (i.e., high impedance state). In such an arrangement a reference voltage VREF can be connected to both the terminals of a comparator 408. In the particular example shown, if a comparator output is high, a negative offset can be detected (neg_offset=1). If a comparator output is low, a positive offset can be detected (neg_offset=0). Offset register 412 can be clocked with a control signal from control block 418, and such an offset value can be captured with the register and provided to a control block 418.

A control block 418 can use an offset value to control the control logic such that the worst-case error can be minimized for positive and/or negative offsets of the comparator, or both. Still further, a control block 418 can utilize an offset register in an update operation to ensure a drift adjustment does not increase the worst case error.

A VIS circuit 400 can also execute calibration operations for both a PU loop 420 and PD loop 422. In a calibration of PU loop 420, switch elements SW_PU, SW1 and SW3 within switch circuit 406 can be closed and switches SW_PD, SW2 and SW4 within switch circuit 406 can be open. According to SAR techniques, a PU code value can be generated by up-down counter 4140. In a calibration of PD loop 422, switch elements SW_PD, SW4, SW$_1$ and SW_PU can be closed while switches SW2 and SW3 can be open. According to SAR techniques, a PD code value can be generated by up-down counter 416-0.

A count value generated during the calibration of PU and PD loops (420 and 422) can be selectively adjusted based on a captured offset value. How such adjustments are made will be described with reference to FIGS. 5 and 6.

Figure 5:
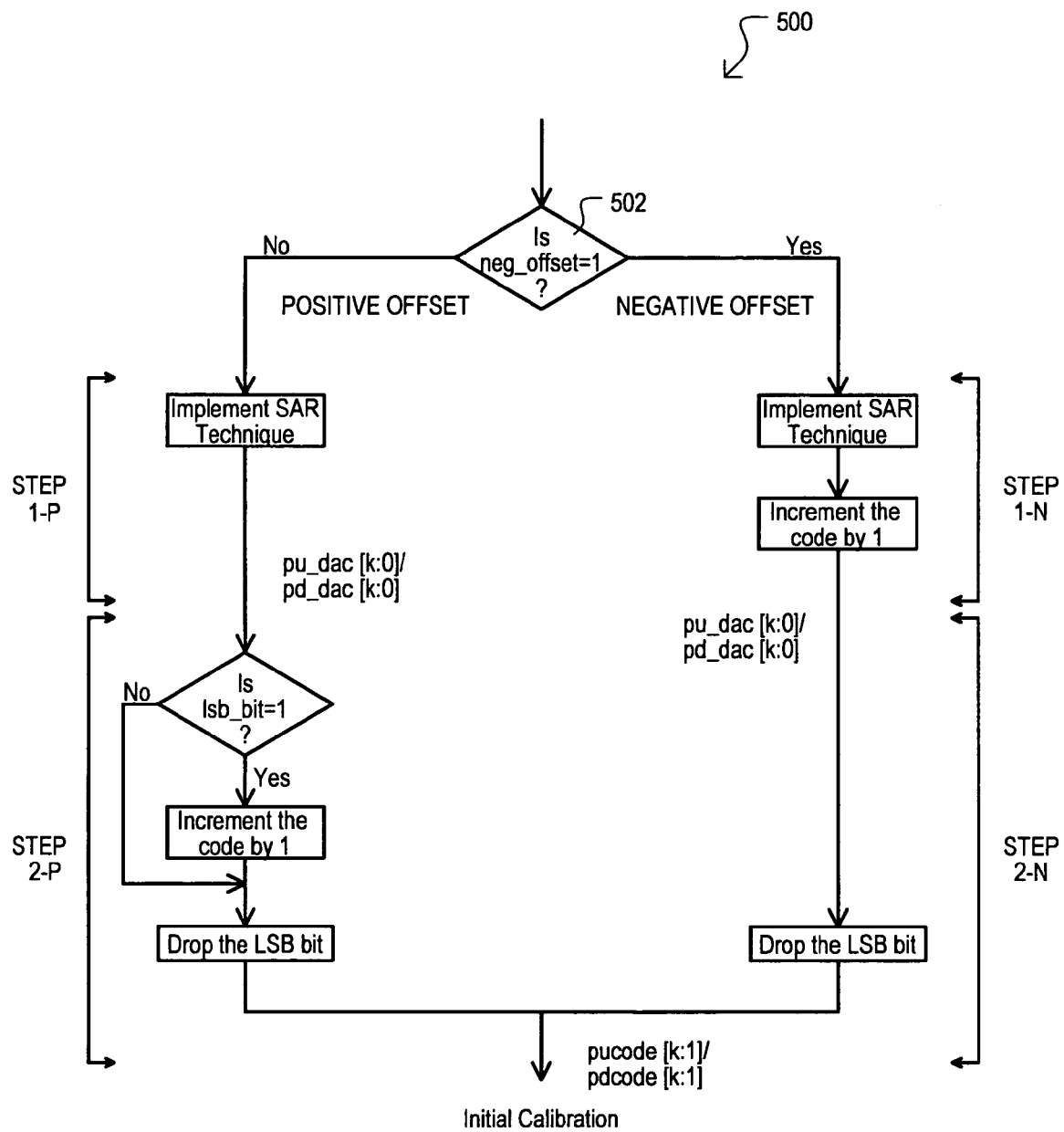
FIG. 5 is a flow diagram of a VIS circuit during initial calibration according to a fifth embodiment of the present invention.

FIG. 5 is a flow diagram showing the operational flow of VIS circuit 400 in an initial calibration operation.

Referring now to FIG. 5, operation 500 can include determining a polarity of an input offset (step 502). In the very particular example shown, such a step can result in the generation of a negative offset value (neg_offset). If such a value is one, a detected input offset was determined to be negative. If such a value is zero, a detected input offset was determined to be positive.

Operation 500 can then generate and adjust (or possibly not adjust) a count value based on a detected input offset. The very particular example of FIG. 5 includes two steps. Operations in response to a positive input offset are shown as STEP1-P and STEP2-P. Operations in response to a negative offset are shown as STEP1-N and STEP2-N.

In a STEP1-P, a VIS circuit 400 can implement a conventional SAR technique to arrive at an initial code value. Such a SAR technique can utilize a comparator 408 to compare a voltage generated at node ZQ-PU (formed by a voltage divider of PU array 402-0 and RQ) or ZQ-PD (formed by a voltage divider of PU array 4040 and PD array 4041). Results of such comparisons can be stored within comparator register 410 and accumulated in a counter (4140 and 416-0).

In a STEP2-P, a least significant bit (LSB) of a code generated by STEP1-P can be examined to see if it is a "1". If the LSB of the final updated code is a '1', the code can be further incremented by 1. Such a step can include an up-down counter (4140 and 416-0) incrementing a code value when the LSB is one and a positive input offset is detected. Such a value can then be stored in a register (e.g., 4141 or 4142, or 416-1 or 416-2) and output via a corresponding MUX (4143 and 416-3). Finally, a STEP2-P can include dropping an LSB of the resulting code. Such a step can include an LSB being omitted as a final code is stored in a final register (4144 and 4164).

Codes generated in STEP2-P can then be used to turn on impedance legs in input/output driver arrays to provide a desired target impedance.

In the case of a negative offset, in a STEP1-N, a VIS circuit 400 can implement a conventional SAR technique to arrive at an initial code value. A code value can then be incremented regardless of an LSB value of the code. In a STEP2-N, an LSB of the resulting code can be dropped.

In this way, initial code values can be generated that take into account the direction of an input offset.

Figure 6:
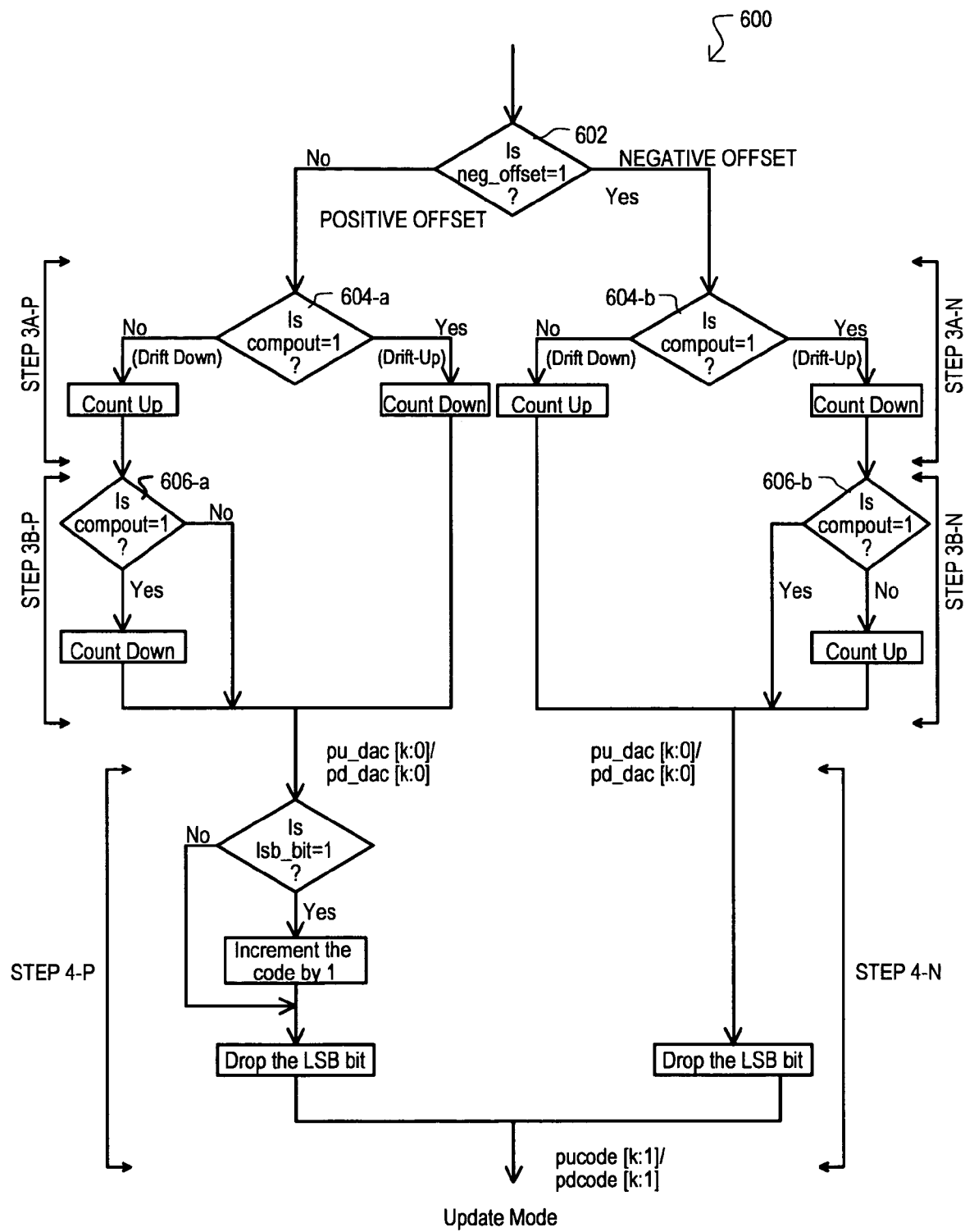
FIG. 6 is a flow diagram of a VIS circuit during an update operation according to a sixth embodiment of the present invention.

FIG. 6 is a flow diagram showing the operational flow of VIS circuit 400 in an update operation according to one embodiment. Following an initial calibration that includes the effect of an input offset, a method 600 can adjust a count value based on a drift value, and then further adjust (or not adjust) such a count value based on the effect of the drift adjustment.

The very particular example of FIG. 6 includes two steps. However, how such steps are executed can depend upon a detected input offset (step 602). Operations in response to a positive input offset are shown as STEP3A-P, STEP3B-P, and STEP4-P. Operations in response to a negative input offset are shown as STEP3A-N, STEP3B-N, and STEP4-N. The detection of a drift value can generate a particular comparator out value (compout).

In a STEP3A-P (positive input offset case), in the event a drift value is in the upward direction (a reduction in effective impedance) (Yes from 604*a*), a count value can be decremented. If, however, a drift value is in the downward direction (an increase in effective impedance) (No from 604*a*), a count value can be incremented.

Unlike conventional approaches that can "blindly" apply a drift update, the operation of FIG. 6 can take into account the effect of such an update.

In a STEP3B-P, still following the positive offset case, in the event the drift value was in the upward direction, no change is made to the code. In contrast, and unlike conventional approaches, in the event the drift value was in the downward direction, the incremented count value can be reapplied to variable impedance elements. A resulting value then be reassessed (step 606-*a*). If the drift adjustment has not resulted in a change in the drift value (compout remains 0), no change can be made to the count value. However, if the drift adjustment has resulted in a change in the drift value (compout now 1), the previous change to the count value can be essentially undone. In the example shown, this can include a decrement (count down) step.

It is understood that the above illustrates an arrangement in which, when an actual drift effect is less than one LSB, a one bit drift adjustment is cancelled. Looked at in another way, the above illustrates an arrangement in which a one bit drift adjustment is put into affect only when an actual drift is greater than (or greater-than-or-equal-to) one LSB. This prevents drift adjustments in response to insignificant changes in impedance from adding to worst case error in a circuit.

The negative input offset case steps follow the same general approach as the positive input offset steps.

In a STEP3A-N, in the event a drift value is in the downward direction (an increase in effective impedance) (No from 604*b*), a count value can be incremented. If a drift value is in the upward direction (Yes from 604*b*), a count value can be decremented.

In a STEP3B-N, the decremented count value can be reapplied to variable impedance elements, and a resulting impedance value reassessed (step 606-*b*). If the drift adjustment has not resulted in a change in the drift value (compout remains 1), no change can be made to the count value. However, if the drift adjustment has resulted in a change in the drift value (compout now 0), the previous change to the count value can be undone.

In this way, the effect of drift adjustments to both PU and PD variable impedance arrays can be measured to ensure additional error is not introduced. Such an arrangement can provide accurate matching to a reference impedance (RQ). At the same time, matching between PU and PD arrays can be improved over conventional arrangements.

Referring still to FIG. 6, in the particular method illustrated, it is assumed that in the application used it will be desirable to drop an LSB of a resulting code, due to unwanted chatter noise or some other adverse affect. Accordingly, following a drift adjustment (and possible readjustment), a method 600 can include steps that drop the LSB of the generated code.

STEP4-P (positive input offset case) shows an LSB of a final code generated by STEP3A-P/3B-P being examined to see if it is a "1". If the LSB of the updated code is not a one, the code is not changed prior to dropping the LSB. If, however, the LSB of the code is a '1', the updated code can be incremented by 1 prior to dropping the LSB. Such an arrangement can help reduce error introduced in such a quantization step.

STEP4-N (negative input offset case) shows an LSB of a final code generated by STEP3A-N/3B-N being dropped, regardless of LSB value.

Advantages of the particular arrangement described with reference to FIGS. 4 through 6 are demonstrated in FIGS. 7 and 8.

Figure 7:
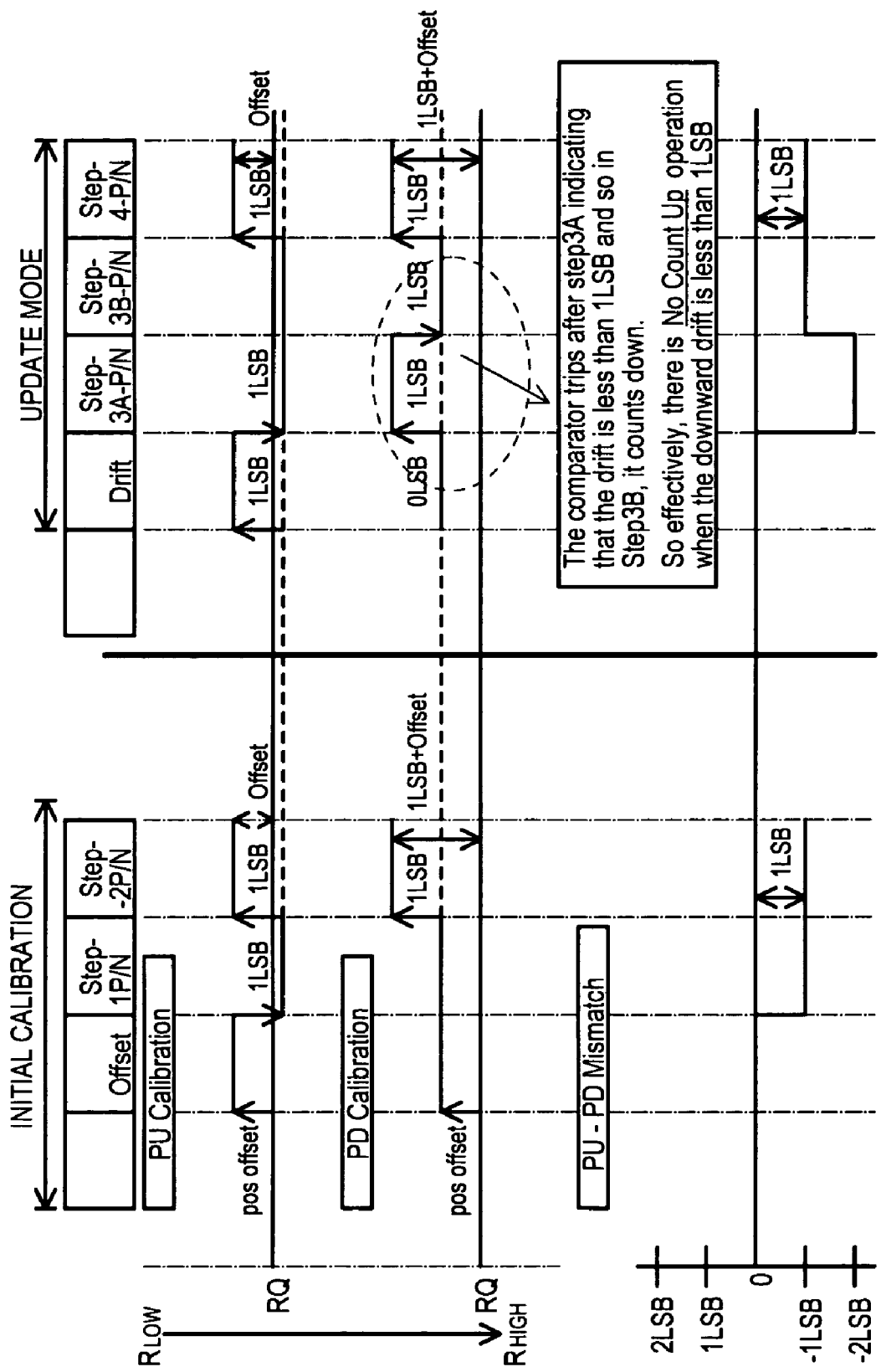
FIG. 7 is a graphical illustration of the propagation of error due to a positive input offset for embodiments of FIGS. 4-6.

FIG. 7 shows the propagation of the worst-case error in a positive offset case. FIG. 7 includes three waveforms. Waveform "PU Calibration" shows a matching between a PU array code and a reference impedance RQ. Waveform "PD Calibration" shows a matching between a PD array code and the reference impedance RQ. Waveform "PU-PD Mismatch" shows a difference between PU and PD array codes.

As can be seen from the waveforms in FIG. 7, update cycle steps STEP3B-N/P can help to determine the amount of the variation in the resistance of the pull-up/pull-down array (due to temperature, voltage and/or other variations) and compensate the PU and PD codes (via count-up/count-down operations) only when the resistance of the pull-up/pull-down array moves away from the target resistance, increasing the error.

In more detail, in FIG. 7, during the update operation of the PD array there is essentially no effective variation in the resistance of the PD array. However, due to the nature of the comparator operation, a control block can effectively sense a downward drift, resulting in a PD code being initially incremented (STEP3A-P) to offset such a detected drift. However, unlike conventional approaches, a PD code can be reapplied and the output of the comparator examined again. If the output of the comparator is high, which is the case in FIG. 7, this indicates that the drift variation is within 1LSB of the target resistance, and thus the initial increment operation will increase error. Consequently, the PD code is decremented by 1LSB (STEP3B-P).

Figure 8:
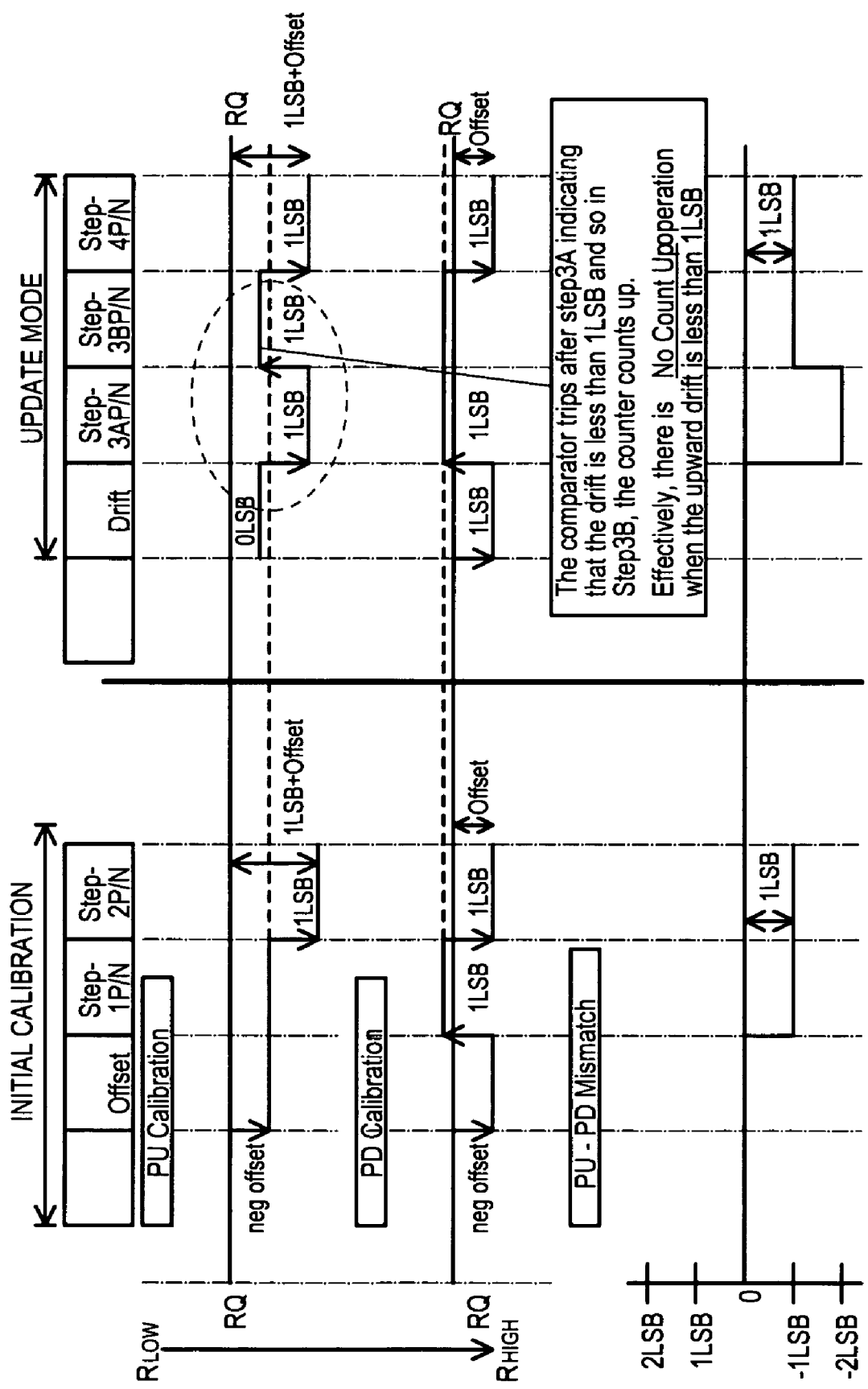
FIG. 8 is a graphical illustration of the propagation of error due to a negative input offset for embodiments of FIGS. 4-6.

FIG. 8 shows the propagation of the worst-case error in a negative offset case, and includes the same waveforms as FIG. 7. As in the case of FIG. 7, update cycle steps can compensate PU and PD codes only when the resistance of the pull-up/pull-down array moves away from the target resistance, increasing the error.

In more detail, in FIG. 8, during the update operation of the PU array, a PU array can have a small variation, such that the output of the comparator trips (low to high). A control block can decrement the PU code in an attempt to counteract the perceived drift up. The newly generated PU code can then be applied to a PU array, and the output of the comparator examined a second time. If the output of the comparator trips, which is the case in FIG. 8, this indicates that the variation is less than 1 LSB. As a result, the PU code can be incremented by 1 LSB to eliminate the drift overcorrection.

As shown in FIGS. 7 and 8, steps STEP3B-P/N executed during an update mode operation can reduce PU-PD matching error to 1 LSB. As would be understood by comparing FIGS. 7 and 8 to FIGS. 14A and 14B, such steps can reduce a worst case PU-PD matching error from 2 LSB to 1 LSB. This can be a 50% reduction in the PU-PD error budget.

A VIS circuit and method according to the above embodiments can provide advantageously accurate matching with respect to three impedance comparisons: PU array to reference impedance (RQ) matching, PD array to RQ matching, and PU array to PD array matching.

A summarization of improvements in worst case error that can be achieved with embodiments of the present invention, as compared to the conventional approaches previously described, is shown in FIG. 9. It is understood that the case "Background Art #1," represents an approach like that of FIG. 11, while "Background Art #2" represents an approach like that of FIG. 12.

In addition, it is noted that the percentage calculation for savings in error budget is based on a output voltage range of 1.2 volts, a comparator input offset of +5 mV, and an overdrive at the comparator of 0.5 mV. Furthermore, the error budget calculation is based on a 10% matching requirement for PU array to RQ matching and PD array to RQ matching, and a 4% matching requirement for PU to PD matching.

Figure 10A:
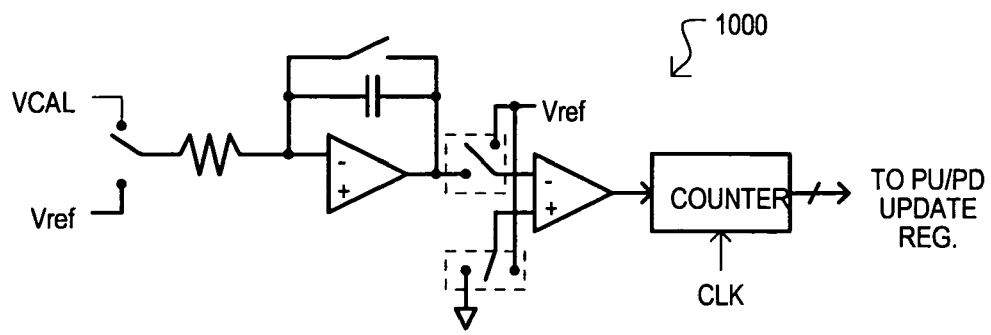
FIGS. 10A to 10C are block schematic diagram of examples of analog-to-digital converters (ADCs) that can be used in alternate embodiments of the present invention.
Figure 10B:
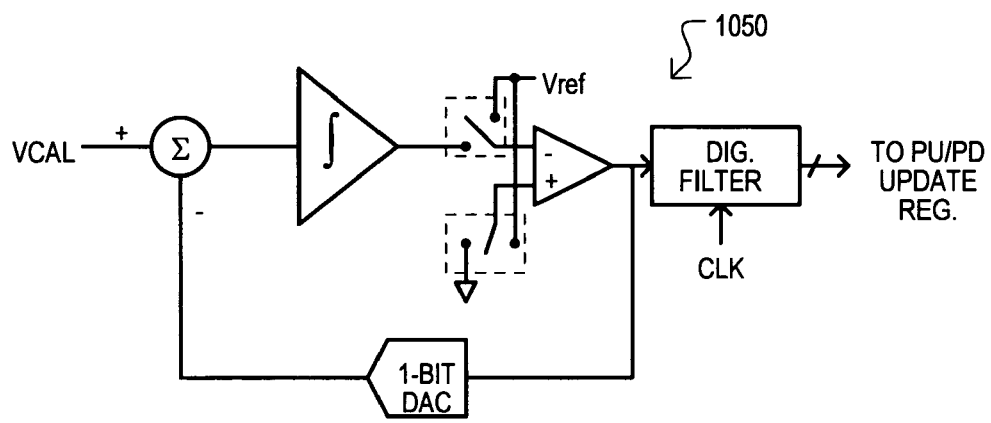
Figure 10C:
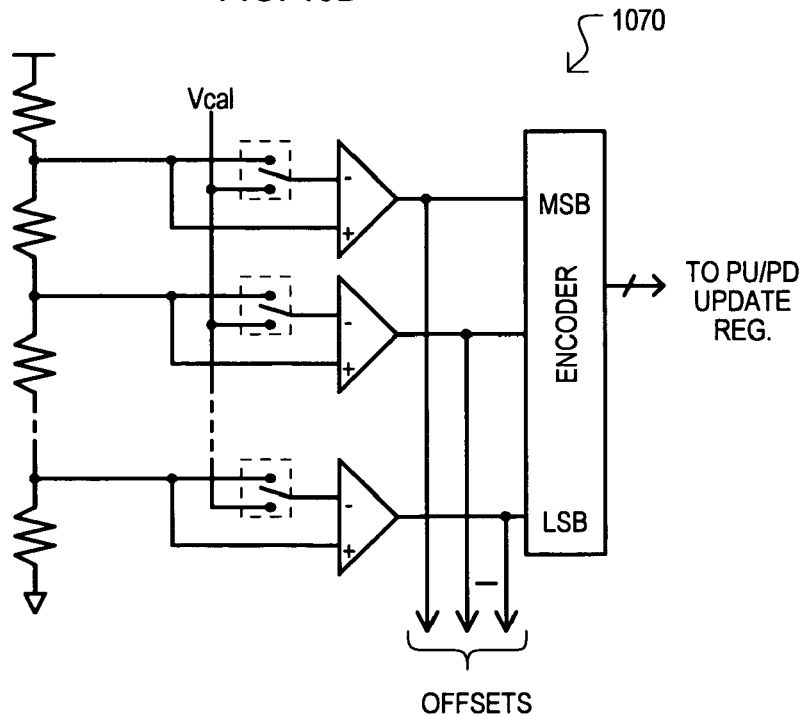

As noted previously, the present invention can encompass a wide variety of embodiments, thus the disclosed embodiments should not necessarily be construed as being limiting to the invention. As but one example, other embodiments can utilize different ADC techniques for generating an impedance establishing code that may (or may not) be altered in response to a detected input offset and drift value. FIGS. 10A to 10C show three of the many alternate ADC approaches that can be utilized in alternate embodiments. FIG. 10A shows a standard integrator type ADC. FIG. 10B shows a "sigma-delta" type ADC. FIG. 10C shows a resistor ladder type ADC. Variations on such basic approaches are well known by those skilled in the art.

For ADC techniques utilizing multiple comparators, an input offset value can be generated based on the effect on each such comparator, or may be generated based on a summed of average input offset at such comparator inputs. In the latter case, multiple offset registers can be employed for each comparator.

Further, while the above embodiments have described arrangements in which adjustments can be made each time an update operation detects a drift value, such an arrangement should not be construed as limiting to the invention. As but one of the many possible alternate embodiments, multiple drift measurements can be made, and adjustments can be implemented once a drift exceeds a certain predetermined limit.

It is understood that the embodiments of the invention may be practiced in the absence of an element and or step not specifically disclosed. That is, an inventive feature of the invention can be elimination of an element or step.

It should be appreciated that reference throughout this specification to "one embodiment" or "an embodiment" means that a particular feature, structure or characteristic is described in connection with the embodiment is included in at least one embodiment of the present invention. Therefore, it is emphasized that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present invention.

Similarly, while the various aspects of the particular embodiments set forth herein have been described in detail, the present invention could be subject to various changes, substitutions, and alterations without departing from the spirit and scope of the invention.

What is claimed is:

1. A variable impedance sense circuit, comprising:
   a comparator having inputs coupled to at least a first array of switchable impedance elements, the comparator outputting a first drift value that indicates a detected change in the impedance of the first array; and
   at least a first counter circuit that generates a count value for calibrating the first array, the at least first counter circuit modifying the count value in response to the first drift value when such a modification does not increase an impedance difference between the first array and a reference impedance to generate an output count value.

2. The variable impedance sense circuit of claim 1, wherein:
   the at least first counter circuit increases an initial count value in response to the drift value having a first value to generate a drift down compensated count, and decreases the initial count value in response to the drift value having a second value to generate a drift up compensated count.

3. The variable impedance sense circuit of claim 2, wherein:
   the comparator outputs a second drift value in response to the first drift value; and
   the at least first counter circuit
      decrements a drift down compensated count if an input offset of the comparator has a first offset value and the second drift value is different from the first drift value, and
      increments a drift up compensated count value if an input offset of the comparator has a second offset value and the second drift value is different from the first drift value.

4. The variable impedance sense circuit of claim 1, wherein:
   the comparator outputs an offset value in response to a same reference value being applied to both comparator inputs; and
   the at least first counter circuit generates a multi-bit initial count value and increments the initial count value in response to the offset value having a first value and a least significant bit (LSB) of one, and increments the initial count value in response to the offset value having a second value.

5. The variable impedance sense circuit of claim 1, wherein:
   the at least first counter circuit comprises a successive approximation register that sequentially sets bit values of the initial binary value according to output values from the comparator, starting with a most significant bit and ending with a least significant bit.

6. The variable impedance sense circuit of claim 1, wherein:
   the first array of variable switchable impedance elements comprises a pull-up array coupled between a calibration node and a high power supply node and coupled to receive the output count value.

7. The variable impedance sense circuit of claim 1, wherein:
   the count value is a binary value; and
   the at least first counter circuit increments the count value to generate the output count value when the drift value has one value, the at least first counter circuit decrements the count value to generate the output count value when the drift value has another value.

8. The variable impedance sense circuit of claim 1, further including:
   the comparator has a first input and a second input; and
   a switch circuit having a first switch element that provides a controllable path between the comparator first input and a reference voltage and a second switch element that provides a controllable path between the comparator second input and the reference voltage.

9. The variable impedance sense circuit of claim 1, wherein:
   the at least first counter circuit includes
      a counter that outputs count values and modified count values,
      a first update register that stores count values,
      a second update register that stores modified count values, and
      a multiplexer having one input coupled to the first update register and another input coupled to the second update register.

10. A method of sensing an impedance value for input/output (I/O) matching that compensates for drifts in variable impedance elements, comprising the steps of:
   detecting a first drift change in variable impedance elements;

generating a multi-bit digital value corresponding to a reference impedance with an analog-to-digital conversion; and adjusting the digital value according to the first drift change in the variable impedance elements when such an adjustment does not increase an impedance difference between the variable impedance elements and the reference impedance.

11. The method of claim 10, wherein:

detecting the first drift change includes applying a reference voltage to one input of a comparator and coupling another input of the comparator to a voltage divider circuit including the reference impedance and the variable impedance elements.

12. The method of claim 10, wherein:

adjusting the digital value includes, if an offset voltage at an input of the comparator has a first polarity and the LSB is one, incrementing the digital value by one, and if the offset voltage has a second polarity incrementing the digital value by one.

13. The method of claim 12, further including:

generating a drift compensation value, comprising if the drift change is in a first direction, incrementing the digital value by one to generate a drift down compensated value, and if the drift change is in a second direction, decrementing the digital value by one to generate a drift up compensated value.

14. The method of claim 13, further including:

if the offset voltage has the first polarity, applying any drift down compensated value to the variable impedance elements to detect a second drift change, and decrementing the drift down compensated value if the second drift change is in a different direction than the first drift change with respect to the reference impedance.

15. The method of claim 13, wherein:

if the offset voltage has the second polarity, applying any drift up compensated value to the variable impedance elements to detect a second drift change, and incrementing the drift up compensated value if the second drift change is in a different direction than the first drift change with respect to the reference impedance.

16. The method of claim 14, further including:

if the offset voltage has the first polarity and the least significant bit (LSB) of the adjusted count value is one, incrementing the adjusted count value by one.

17. A variable impedance sensing architecture, comprising:

an analog-to-digital converter (ADC) circuit having inputs coupled to a first variable impedance array and a second variable impedance array that outputs a drift indication reflecting a change in at least one of the variable impedance arrays and an input offset indication; and a counter/control circuit that selectively adjusts a binary code representing an impedance of at least one of the variable impedance arrays in response to at least the drift indication value and the input offset indication.

18. The variable impedance sensing architecture of claim 17, wherein:

the counter/control circuit adjusts the binary code in response to the drift indication and offset indication having one set of values and does not adjust the binary code in response to the drift indication and offset indication having another set of values.

19. The variable impedance sensing architecture of claim 17, wherein:

the ADC circuit is a successive approximation register (SAR) type ADC comprising, a comparator having inputs coupled to the first variable impedance array and second variable impedance array, and an output coupled to a SAR register.

20. The variable impedance sensing architecture of claim 17, wherein:

the counter/control circuit comprises a successive approximation register (SAR) store comprising a counter, a first update register coupled to the SAR store to receive the binary code, and a second update register coupled to the SAR store to receive the updated binary code.

21. The variable impedance sensing architecture of claim 17, wherein:

the counter/control circuit selectively adjusts a first binary code representing an impedance of a pull-up variable impedance array in response to at least the drift indication value and the input offset indication, and selectively adjusts a second binary code representing an impedance of a pull-down variable impedance array in response to at least the drift indication value and the input offset indication.

* * * * *